(12) United States Patent
Kutchko et al.

(10) Patent No.: US 10,619,099 B2
(45) Date of Patent: Apr. 14, 2020

(54) DIELECTRIC DEVICES AND METHODS OF FABRICATION

(71) Applicant: PPG Industries Ohio, Inc., Cleveland, OH (US)

(72) Inventors: Cynthia Kutchko, Pittsburgh, PA (US); Zoubeida Ounaies, University Park, PA (US); Hassene Ben Atitallah, Eden Prarie, MN (US); Nicholas Wyckoff, Toms River, NJ (US); Anil Kumar, Murrysville, PA (US); Romain Stalder, Pittsburgh, PA (US); David Walters, Slippery Rock, PA (US)

(73) Assignee: PPG Industries Ohio, Inc., Cleveland, OH (US)

( * ) Notice: Subject to any disclaimer, the term of this patent is extended or adjusted under 35 U.S.C. 154(b) by 102 days.

(21) Appl. No.: 15/686,436

(22) Filed: Aug. 25, 2017

(65) Prior Publication Data

US 2019/0062635 A1    Feb. 28, 2019

(51) Int. Cl.
| | | |
|---|---|---|
| *C09K 19/34* | (2006.01) | |
| *C09K 19/54* | (2006.01) | |
| *C09K 19/38* | (2006.01) | |
| *C09K 19/20* | (2006.01) | |
| *H01L 41/193* | (2006.01) | |
| *C09K 19/30* | (2006.01) | |
| *C09K 19/04* | (2006.01) | |

(52) U.S. Cl.
CPC ........ *C09K 19/544* (2013.01); *C09K 19/0403* (2013.01); *C09K 19/2007* (2013.01); *C09K 19/3068* (2013.01); *C09K 19/3833* (2013.01); *C09K 19/3852* (2013.01); *H01L 41/193* (2013.01); *C09K 2019/0448* (2013.01); *C09K 2019/2042* (2013.01); *C09K 2019/2078* (2013.01); *C09K 2019/3083* (2013.01)

(58) Field of Classification Search
CPC ...................................... C09K 19/04
See application file for complete search history.

(56) References Cited

U.S. PATENT DOCUMENTS

| | | | |
|---|---|---|---|
| 7,060,200 B1* | 6/2006 | Farrand | C09K 19/0403 |
| | | | 252/299.01 |
| 8,628,685 B2 | 1/2014 | He et al. | |
| 2007/0165308 A1* | 7/2007 | Wang | G02B 5/3083 |
| | | | 359/489.07 |
| 2009/0323012 A1 | 12/2009 | He et al. | |
| 2010/0014010 A1 | 1/2010 | He et al. | |
| 2011/0135850 A1 | 6/2011 | Saha et al. | |
| 2012/0069279 A1* | 3/2012 | Harrold | G02B 3/0006 |
| | | | 349/119 |
| 2013/0056680 A1* | 3/2013 | Lee | C09K 19/20 |
| | | | 252/299.63 |
| 2015/0147490 A1* | 5/2015 | Ryu | G02B 5/3016 |
| | | | 428/1.33 |
| 2016/0200981 A1* | 7/2016 | Lee | C09K 19/408 |
| | | | 428/1.32 |
| 2017/0253801 A1* | 9/2017 | Bae | C09K 19/3003 |

FOREIGN PATENT DOCUMENTS

EP    1669431    6/2006

* cited by examiner

*Primary Examiner* — Chanceity N Robinson
(74) *Attorney, Agent, or Firm* — William R. Lambert

(57) ABSTRACT

Self-aligned liquid crystal materials and structures are disclosed. The structures can exhibit piezoelectric and flexoelectric properties.

22 Claims, 2 Drawing Sheets

DIELECTRIC DEVICES AND METHODS OF FABRICATION

FIELD

The present invention relates to dielectric devices fabricated using mesogenic compounds and to methods of fabricating dielectric devices using mesogenic compounds. The materials and methods can be used to fabricate piezoelectric and flexoelectric devices.

BACKGROUND

Piezoelectric and flexoelectric properties play an important role in many applications, such as sensors, actuators, and energy generators. A piezoelectric material can have an electrical field induced when a homogeneous strain is applied, and materials exhibiting flexoelectricity can have a spontaneous electrical polarization when induced by a strain gradient. Unlike piezoelectricity which requires structures with no inversion symmetry, flexoelectricity can emerge even in centrosymmetric materials due to the inhomogeneous strain locally breaking inversion symmetry.

Several polymers exhibit piezoelectric and flexoelectric responses, such as polyvinylidene fluoride (PVDF) and polyamides. The polymer crystallites can be oriented by poling using a high electric field at an elevated temperature. Poling can be difficult to control and can result in burning and charring of the polymeric film or coating.

SUMMARY

According to the present invention, polymerizable compositions comprise: a solvent; and a combination of polymerizable mesogenic monomers.

According to the present invention, dielectric devices comprise a dielectric layer, wherein the dielectric layer is prepared from the polymerizable composition according to the present invention.

According to the present invention, parts comprise a dielectric device according to the present invention.

According to the present invention, methods of preparing a dielectric layer, comprising: aligning a surface; applying the polymerizable composition according to the present invention to the aligned surface, wherein the polymerizable composition comprises a combination of polymerizable mesogenic monomers; allowing the applied combination of polymerizable mesogenic monomers to align; and polymerizing the aligned combination of polymerizable mesogenic monomers to form a dielectric layer.

According to the present invention, dielectric layers are prepared by methods according to the present invention.

BRIEF DESCRIPTION OF THE DRAWINGS

Those skilled in the art will understand that the drawings described herein are for illustration purposes only. The drawings are not intended to limit the scope of the present disclosure.

DETAILED DESCRIPTION

Figure 1:
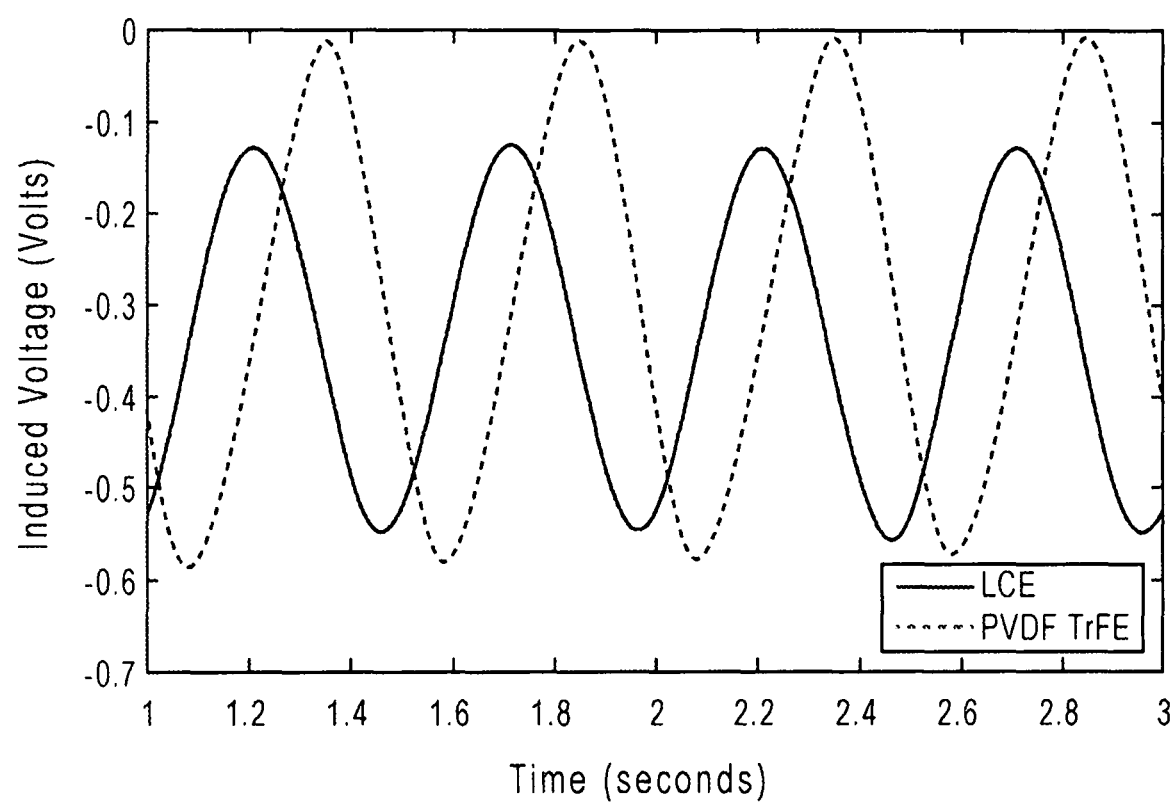
FIG. 1 shows the flexoelectric response for three-point bending of a dielectric layer provided by the present disclosure on an aluminum substrate with 0.01% strain at 2 Hz.

For purposes of the following description, it is to be understood that embodiments provided by the present disclosure may assume various alternative variations and step sequences, except where expressly specified to the contrary. Moreover, other than in the examples, or where otherwise indicated, all numbers expressing, for example, quantities of ingredients used in the specification and claims are to be understood as being modified in all instances by the term about. Accordingly, unless indicated to the contrary, the numerical parameters set forth in the following specification and attached claims are approximations that may vary depending upon the desired properties to be obtained. At the very least, and not as an attempt to limit the application of the doctrine of equivalents to the scope of the claims, each numerical parameter should at least be construed in light of the number of reported significant digits and by applying ordinary rounding techniques.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard variation found in their respective testing measurements.

Also, it should be understood that any numerical range recited herein is intended to include all sub-ranges encompassed therein. For example, a range of 1 to 10 is intended to include all sub-ranges between (and including) the recited minimum value of about 1 and the recited maximum value of about 10, that is, having a minimum value equal to or greater than about 1 and a maximum value of equal to or less than about 10. Also, in this application, the use of or means and/or unless specifically stated otherwise, even though and/or may be explicitly used in certain instances.

Reference is now made to certain compounds, compositions, and methods of the present invention. The disclosed compounds, compositions, and methods are not intended to be limiting of the claims. To the contrary, the claims are intended to cover all alternatives, modifications, and equivalents.

Cured layers provided by the present disclosure can exhibit flexoelectric properties and can produce an electrical signal in response to a force and/or mechanical actuation in response to an electric field. A layer includes films and coatings, where a coating refers to an outer layer.

In the direct flexoelectric effect, an applied force induces stress gradients within a structure, leading to an electrical signal generated in response to the stress gradient. The electrical signal is a flexoelectric signal. Unlike the piezoelectric effect, the flexoelectric effect requires a stress gradient. A structure can undergo a bending or flexural deformation on application of the force. Electrodes may be located so as to collect the flexoelectric signal, for example, located proximate regions of a stress gradient.

In the converse flexoelectric effect, application of an electrical field induces electrical field gradients within the structure. These electrical field gradients induce an actuating force through the flexoelectric effect, in this example the converse effect. In this case, electrodes can be located so that an electrical field gradient is generated.

The flexoelectric effect relates to an electric polarization induced by a strain gradient within a material, and the converse effect is a strain in the material induced by an electric field gradient. A flexoelectric material can be centrosymmetric, which would seem to rule out any piezoelectric effect.

The flexoelectric effect is defined by the relationship: $P_l = \mu_{ijkl} (\partial S_{ij}/\partial X_k)$; where $\mu_{ijkl}$ are the fourth rank polar tensor flexoelectric coefficients, $S_{ij}$ is the elastic strain components. $X_k$ is the direction of the gradient in S, and $P_l$ is the induced electric polarization.

For flexoelectricity there is also a converse effect, i.e. there is an elastic stress generated by an electric field gradient defined by the relationship: $T_{ij} = \mu_{ijkl} (\partial E_k/\partial X_l)$; where $E_k$ is the electric field, xl the direction of the gradient in E, and $T_{ij}$ the induced stress.

For the direct effect in the MKS system, units for μ are coulombs/meter (C/m), and for the converse effect the units are Newton/volt (N/V), which are equivalent because the direct and converse flexoelectric effects are thermodynamically identical.

Cured layers provided by the present disclosure can exhibit piezoelectric properties. When stress is applied to a piezoelectric material layer, electrical polarization by which opposite charges appear on both end faces of the piezoelectric material layer in proportion to the applied stress results. And, when a piezoelectric material is placed in an electric field, the piezoelectric layer exhibits a property (piezoelectric effect) in which strain is generated in proportion to the applied electric field. Specifically, in the case of a piezoelectric layer a large piezoelectric effect appears via polarization caused by orientation of the dipole moment in the oriented polymer. When the piezoelectric material layer is subjected to application of energy such as heat, in response to this, a level of spontaneous polarization inside the piezoelectric layer is altered.

Materials and methods for fabricating piezoelectric and flexoelectric layers that can be aligned without poling are desired.

A polymerizable layer comprising mesogenic compounds provided by the present disclosure can self-align on an oriented substrate without the use of poling methods and can be polymerized to form thin piezoelectric and flexoelectric layers.

Methods provided by the present disclosure can comprise aligning a substrate surface by rubbing, coating the aligned surface with a composition comprising a polymerizable mesogenic compound or combination of polymerizable mesogenic-containing compounds, allowing the mesogenic compounds to self-align, and curing the polymerizable mesogenic compounds to provide a thin layer exhibiting piezoelectric and/or flexoelectric properties.

A dielectric device prepared from self-aligned polymerizable mesogenic compounds can comprise an electrically conductive layer, an alignment layer overlying the substrate, a dielectric layer comprising polymerized mesogenic compounds, and an overlying electrically conductive layer.

An electrically conductive material can comprise a material that is intrinsically electrically conductive or may comprise a layer of an electrically conductive material overlying an electrically insulating substrate.

A substrate can include any suitable substrate such as, for example, a metal, an alloy, a composite, a ceramic, glass, or a polymer. A substrate can be electrically conductive or a surface of the substrate can include a layer or coating of an electrically conductive material. For example, an electrically conductive coating can comprise indium tin oxide (ITO).

A substrate on which the dielectric layer is applied can be any suitable thickness. For example, the substrate can be a flexible sheet or flexible layer.

A substrate surface onto which a liquid crystal composition is applied can be characterized by an RMS smoothness/roughness, for example, from scanning confocal microscopy or use profilometry.

A surface of the substrate can comprise an alignment layer. An alignment layer can comprise a thin layer of material that generates aligned physical features such as aligned grooves when a mechanical force is applied to the alignment layer such as by rubbing or buffing the thin layer.

An alignment layer can be applied to an electrically conductive substrate or to an electrically conductive layer overlying a substrate surface. An alignment layer can be applied, for example, by dipping, brushing, rolling, spraying, wiping, or by any other suitable method. An alignment layer can be characterized by a thickness, for example, from 5 μm to 100 μm, from 5 μm to 50 μm, or from 5 μm to 25 μm.

Examples of suitable alignment layer materials include alcohols such as polyvinyl alcohol, triacetate cellulose, and polyimides. The materials comprising the alignment layer can be applied as a solution and allowed to drying before generating alignment features using mechanical force.

Alignment features can be generated on the alignment layer by rubbing, buffing, or other suitable method. For example, alignment features can be generated on the alignment layer by wiping a felt cloth or rotating rubbing wheel across the surface of the alignment layer.

A surface can also be aligned by grooving or using photo-alignment methods.

After the alignment layer has been oriented, a dielectric composition comprising a polymerizable mesogenic material can be applied to the aligned surface of the alignment layer.

A dielectric composition can include a solvent, a polymerizable mesogenic compound, and a surfactant. For photopolymerizable liquid crystal compositions, a composition can comprise a photoinitiator. For thermally-activated polymerizable liquid crystal compositions, a composition can comprise a thermal initiator.

Suitable solvents can dissolve the solid components of the polymerizable dielectric composition, are compatible with the surface to which the dielectric composition is applied, and can uniformly disperse the solid components across an aligned substrate surface. A suitable solvent can also be capable of evaporating after application and alignment of the mesogenic compounds.

A dielectric composition can comprise, for example, from 20 wt % to 60 wt % of a solvent or a combination of solvents, from 25 wt % to 55 wt %, from 30 wt % to 50 wt %, or from 35 wt % to 45 wt % of a solvent or a combination of solvents, where wt % is based on the total weight of the composition.

In dielectric compositions a solvent can be a polar solvent. Examples of suitable polar solvents include anisole.

Examples of suitable solvents include propylene glycol monomethyl ether acetate and derivatives thereof, acetone, amyl propionate, anisole, benzene, butyl acetate, cyclohexane, dialkyl ethers of ethylene glycol, e.g., diethylene glycol dimethyl ether and their derivatives, diethylene glycol dibenzoate, dimethyl sulfoxide, dimethyl formamide, dimethoxybenzene, ethyl acetate, isopropyl alcohol, methyl cyclohexanone, cyclopentanone, methyl ethyl ketone, methyl isobutyl ketone, methyl propionate, propylene carbonate, tetrahydrofuran, toluene, xylene, 2-methoxyethyl ether, 3-propylene glycol methyl ether, and combinations of any of the foregoing.

Dielectric compositions can comprise a mesogenic compound or combination of mesogenic compounds.

Suitable mesogenic compounds are disclosed, for example, in U.S. Pat. No. 8,628,685, in U.S. Application Publication No. 2010/0014010, and in U.S. Application Publication No. 2009/0323012, each of which is incorporated by reference in its entirety.

A mesogenic compound comprises a mesogenic portion and a flexible portion.

The mesogenic portion of a compound can comprise a rigid moiety which aligns with other mesogenic portions in a composition comprising mesogenic compounds, thereby aligning the mesogenic compounds in one direction. The rigid portion of the mesogen may comprise a rigid molecular structure, such as a mono or polycyclic ring structure, including, for example, mono or polycyclic aromatic ring structures. Examples of mesogens include the mesogenic compounds disclosed in Demus et al., *Flussige Kristalle in Tabellen*, VEB Deutscher Verlag fur Grundstoffindustrie, Leipzig, 1974 and *Flussige Kristalle in Tabellen II*, VEB Deutscher Verlag fur Grundstoffindustrie, Leipzig, 1984. Mesogenic compounds may also include one or more flexible portions. The one or more flexible portions may impart fluidity to the mesogenic compound. Mesogenic compounds may exist in a non-ordered state or in an ordered or aligned state. Mesogenic compounds in a non-ordered state can adopt an essentially random orientation such that there is no general orientation to the mesogenic compound. Mesogenic compounds in the ordered or aligned state can adopt an orientation in which the mesogenic portions of the compounds are at least partially aligned throughout the composition.

Mesogenic compounds can comprise at least one mesogen unit, at least one reactive group, and at least one flexible linking group which may be, for example, from 1 atomic bond to 500 atomic bonds in linear length. A mesogenic compound can comprise one reactive group or two reactive groups.

Mesogenic compounds can comprise compounds having the structure of Formula (1):

$$P\text{-}L_{w'}\text{-}(-M^1\text{-}X)_z \quad (1)$$

In mesogenic compounds of Formula (1), each X can independently comprise:

(i) a group —R;
(ii) a group -(L)$_y$-R;
(iii) a group -(L)-R;
(iv) -(L)$_w$-Q;
(v) a group having the structure of Formula (2):

$$\text{-}L_y\text{-}M^2\text{-}L_{w'}\text{-}P \quad (2)$$

(vi) -L$_y$-P; or
(vii) -L$_{w'}$-[(L)$_w$-P]$_y$.

In compounds of Formula (1), each P can comprise a reactive group. A reactive group refers to an atom, bond, or functional group that may react to form a bond, such as a covalent, polar covalent, or ionic bond with another molecule. For example, a reactive group may react with a group, react with a co-monomer, or a reactive group on a developing polymer such that the structure corresponding to Formula (1) or a residue thereof is incorporated into the polymer. Each reactive group P can independently comprise, for example, aziridinyl, hydrogen, hydroxyl, aryl, alkyl, alkoxy, amino, alkylamino, alkylalkoxy, alkoxyalkoxy, nitro, polyalkyl ether, $C_{1-6}$ alkyl, $C_{1-6}$ alkoxy($C_{1-6}$)alkyl, polyethyleneoxy, polypropyleneoxy, ethanediyl, acrylate, methacrylate, 2-chloroacrylate, 2-phenylacrylate, acryloylphenylene, acrylamide, methacrylamide, 2-chloroacrylamide, 2-phenylacrylamide, oxetane, epoxy, glycidyl, cyano, isocyanato, thiol, thioisocyanato, itaconic acid ester, vinyl ether, vinyl ester, a styrene derivative, siloxane, ethyleneimine derivatives, carboxylic acid, alkene, maleic acid derivatives, fumaric acid derivatives, unsubstituted cinnamic acid derivatives, cinnamic acid derivatives that are substituted with at least one of methyl, methoxy, cyano and halogen, or substituted or unsubstituted chiral or non-chiral monovalent or divalent groups chosen from steroid radicals, terpenoid radicals, alkaloid radicals and mixtures thereof, wherein the substituents can independently be alkyl, alkoxy, amino, cycloalkyl, alkylalkoxy, fluoroalkyl, cyano, cyanoalkyl, cyanoalkoxy or combinations of any of the foregoing.

A reactive group P can comprise a polymerizable group, wherein the polymerizable group may be any functional group capable of participating in a polymerization reaction.

For example, polymerization reactions include addition polymerization in which free radicals serve as the initiating agents that react with the double bond of a monomer by adding to it on one side at the same time producing a new free electron on the other side; condensation polymerization in which two reacting molecules combine to form a larger molecule with elimination of a small molecule, such as a water molecule; and oxidative coupling polymerization. A reactive group P may be an unsubstituted or substituted ring opening metathesis polymerization precursor. Examples of suitable polymerizable groups include hydroxyl, acryloxy, methacryloxy, 2-(acryloxy)ethylcarbamyl, 2-(methacryloxy)ethylcarbamyl, isocyanato, aziridine, allylcarbonate, and epoxy groups such as oxiranylmethyl. A reactive group P can comprise a plurality of reactive groups. For example, reactive group P can comprise from 2 to 4 reactive groups. Having multiple reactive groups on P may provide for more effective incorporation into a polymer or provide for cross-linking between individual polymer strands. Examples of a suitable reactive group P comprising multiple reactive groups include diacryloyloxy($C_{1-6}$)alkyl, diacryloyloxyaryl; triacryloyloxy($C_{1-6}$)alkyl, triacryloyloxyaryl, tetraacryloyloxy($C_{1-6}$)alkyl, tetraacryloyloxyaryl, dihydroxy($C_{1-6}$)alkyl, trihydroxy($C_{1-6}$)alkyl, tetrahydroxy($C_{1-6}$)alkyl, diepoxy ($C_{1-6}$)alkyl, diepoxyaryl, triepoxy($C_{1-6}$)alkyl, triepoxyaryl, tetraepoxy($C_{1-6}$)alkyl, tetraepoxyaryl, diglycidyloxy($C_{1-6}$) alkyl, diglycidyloxyaryl; triglycidyloxy($C_{1-6}$)alkyl, triglycidyloxyaryl, tetraglycidyloxy($C_{1-6}$)alkyl, and tetraglycidyloxyaryl.

In mesogenic compounds of Formula (1), each group Q can comprise, for example, hydroxyl, amine, alkenyl, alkynyl, azido, silyl, silylhydride, oxy(tetrahydro-2H-pyran-2-yl), isocyanato, thiol, thioisocyanato, carboxylic acid, carboxylic ester, amide, carboxylic anhydride, or acyl halide. The group Q may act as a reactive group such that a mesogenic compound comprising at least one group Q may be incorporated into the backbone of a polymer or copolymer. For example, Q may be a polymerizable group, such as those described herein, including hydroxyl, acryloxy, methacryloxy, 2-(acryloxy)ethylcarbamyl, 2-(methacryloxy)ethylcarbamyl, isocyanato, thiol, thioisocyanato, aziridine, allylcarbonate, carboxylic acid or carboxylic acid derivative, or epoxy, e.g., oxiranylmethyl. As used herein, the terms (meth)acryloxy and (meth)acryloyloxy are used interchangeably and refer to a substituted or unsubstituted prop-2-en-1-oyloxy structure.

In mesogenic compounds of Formula (1), the groups -L-, -(L)$_y$- or -(L)$_w$- represent linking groups having a linear length of from 1 to 500 atomic bonds, such as from 1 to 200, from 1 to 100, or from 1 to 50 atomic bonds. That is, for the general structure F-L-E, the longest linear length of the linking group between groups F and E (where groups F and E may each generally represent any of groups P, R, Q, X or a mesogen) can range from 1 to 500 bonds (inclusive of the intervening atoms). It should be understood that when discussing the linear length of the linking group, the length of the linking group may be calculated by determining the length of each of the bonds in the linear sequence and the distance occupied by the various intervening atoms in the linear sequence of the linking group and totaling the values. The longest linear sequence of bonds may be at least 25 bonds between the linked groups. The longest linear sequence of bonds may be at least 30 bonds. The longest linear sequence of bonds may be at least 50 bonds. A linking group of at least 25 bonds can improve the solubilities of the additives, such as the photochromic compounds in compositions comprising the mesogenic compounds; may provide for faster or improved alignment properties of the compositions comprising the mesogenic compounds; and/or may lower the viscosity of a composition comprising the mesogenic compound.

Each group -L- can independently be selected from a single bond, a polysubstituted, monosubstituted or unsubstituted spacer including aryl, $(C_{1-30})$alkyl, $(C_{1-30})$alkylcarbonyloxy, $(C_{1-30})$alkylamino, $(C_{1-30})$alkoxy, $(C_{1-30})$perfluoroalkyl, $(C_{1-30})$perfluoroalkoxy, $(C_{1-30})$alkylsilyl, $(C_{1-30})$dialkylsiloxyl, $(C_{1-30})$alkylcarbonyl, $(C_{1-30})$alkoxycarbonyl, $(C_{1-30})$alkylcarbonylamino, $(C_{1-30})$alkylaminocarbonyl, $(C_{1-30})$alkylcarbonate, $(C_{1-30})$alkylaminocarbonyloxy, $(C_{1-30})$alkyloxycarbonylamino, $(C_{1-30})$alkylurethane, $(C_{1-30})$alkylurea, $(C_{1-30})$alkylthiocarbonylamino, $(C_{1-30})$alkylaminocarbonylthio, $(C_{2-30})$alkene, $(C_{1-30})$thioalkyl, $(C_{1-30})$alkylsulfone, and $(C_{1-30})$alkylsulfoxide, wherein each substituent can independently be, for example, $(C_{1-5})$alkyl, $(C_{1-5})$alkoxy, fluoro, chloro, bromo, cyano, $(C_{1-5})$alkanoate ester, isocyanato, thioisocyanato, or phenyl.

The variable w may be an integer from 1 to 26, y may be an integer from 2 to 25, and z can be 1 or 2.

It should be noted that when more than one L group occurs in sequence, for example in the structure $-(L)_y-$ or $-(L)_w-$ where y and/or w is an integer greater than 1, then the adjacent L groups may or may not have the same structure. That is, for example, in a linking group having the structure $-(L)_3-$ or -L-L-L- (i.e., where y or w is 3), each group -L- can independently be any of the groups L recited herein and the adjacent -L- groups may or may not have the same structure. For example, -L-L-L- may represent $-(C_{1-30})$alkyl-$(C_{1-30})$alkyl-$(C_{1-30})$alkyl- (i.e., where each occurrence of -L- is represented by $(C_{1-30})$alkyl, where each adjacent $(C_{1-30})$alkyl group may have the same or different number of carbons in the alkyl group). As another example, -L-L-L- may represent -aryl-$(C_{1-30})$alkylsilyl-$(C_{1-30})$alkoxy- (i.e., where each occurrence of -L- differs from the adjacent groups -L-). Thus, the structure of $(L)_y$ or $(L)_w$ should be understood as covering all possible combinations of the various sequences of the linking groups -L-, including those where some or all of the adjacent -L- groups are the same and where all the adjacent -L- groups are different.

In mesogenic compounds of Formula (1), the group R can comprise an end group such as hydrogen, $C_{1-18}$ alkyl, $C_{1-18}$ alkoxy, $C_{1-18}$ alkoxycarbonyl, $C_{3-10}$ cycloalkyl, $C_{3-10}$ cycloalkoxy, poly($C_{1-18}$ alkoxy), or a straight-chain or branched $C_{1-18}$ alkyl group that is unsubstituted or substituted with cyano, fluoro, chloro, bromo, or $C_{1-18}$ alkoxy, or poly-substituted with fluoro, chloro, or bromo.

In mesogenic compounds of Formula (1), the groups $M^1$ and $M^2$ represent mesogenic groups and can each independently be a rigid straight rod-like liquid crystal group, a rigid bent rod-like liquid crystal, or a rigid disc-like liquid crystal group. The structures for $M^1$ and $M^2$ may be any suitable mesogenic group such as, for example, any of those recited in Demus et al., *Flussige Kristalle in Tabellen*, VEB Deutscher Verlag fur Grundstoffindustrie, Leipzig, 1974 or *Flussige Kristalle in Tabellen II*, VEB Deutscher Verlag fur Grundstoffindustrie, Leipzig, 1984.

Mesogen groups $M^1$ and $M^2$ may independently have a structure of Formula (3):

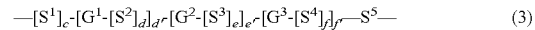

$$-[S^1]_c-[G^1-[S^2]_d]_{d'}-[G^2-[S^3]_e]_{e'}-[G^3-[S^4]_f]_{f'}-S^5- \quad (3)$$

In mesogenic groups of Formula (3) each of $G^1$, $G^2$, and $G^3$ may independently comprise a divalent group such as: an unsubstituted or a substituted aromatic group, an unsubstituted or a substituted alicyclic group, an unsubstituted or a substituted heterocyclic group, and mixtures thereof, wherein substituents can be, for example, thiol, amide, hydroxy($C_{1-18}$)alkyl, isocyanato($C_{1-18}$)alkyl, acryloyloxy, acryloyloxy($C_{1-18}$)alkyl, halogen, $C_{1-18}$ alkoxy, poly($C_{1-18}$ alkoxy), amino, amino($C_{1-18}$)alkylene, $C_{1-18}$ alkylamino, di-($C_{1-18}$)alkylamino, $C_{1-18}$ alkyl, $C_{2-18}$ alkene, $C_{2-18}$ alkyne, $C_{1-18}$ alkyl($C_{1-18}$)alkoxy, $C_{1-18}$ alkoxycarbonyl, $C_{1-18}$ alkylcarbonyl, $C_{1-18}$ alkyl carbonate, aryl carbonate, perfluoro ($C_{1-18}$)alkylamino, di-(perfluoro($C_{1-8}$)alkyl)amino, $C_{1-18}$ acetyl, $C_{3-10}$ cycloalkyl, $C_{3-10}$ cycloalkoxy, isocyanato, amido, cyano, nitro, a straight-chain or branched $C_{1-18}$ alkyl group that is mono-substituted with cyano, halo, or $C_{1-18}$ alkoxy, or poly-substituted with halo, and a group comprising one of the following formulae: $M(T)_{(t-1)}$ and $M(OT)_{(t-1)}$, where M can be aluminum, antimony, tantalum, titanium, zirconium, or silicon, T can be an organofunctional radical, an organofunctional hydrocarbon radical, an aliphatic hydrocarbon radical or an aromatic hydrocarbon radical, and t is the valence of M.

In mesogenic groups of Formula (3), each of c, d, e, and f may independently be an integer ranging from 0 to 20, inclusive; and each of d', e' and f' can independently be an integer from 0 to 4 provided that a sum of d'+e'+f' is at least 1.

In mesogenic groups of Formula (3), the groups S can be spacer groups such that each of groups $S^1$, $S^2$, $S^3$, $S^4$, and $S^5$ can independently selected from one of groups (i), (ii), or (iii):

(i) $-(CH_2)_g-$, $-(CF_2)_h-$, $-Si(CH_2)_g$, and h is a whole number from 1 to 16 inclusive;

(ii) $-N(Z)$, $-C(Z)=C(Z)$, $-C(Z)=N$, $-C(Z')_2$ $-C(Z')_2$, or a single bond, wherein each Z is independently hydrogen, $C_{1-6}$ alkyl, cycloalkyl, or aryl, and each Z' is independently $C_{1-6}$ alkyl, cycloalkyl, or aryl; or (iii) $-O-$, $-C(O)-$, $-CH=CH-$, $-N=N-$, $-S-$, $-S(O)-$, $-S(O)_2-$, $-S(O)_2-O-$, $-O-S(O)_2-O-$ or straight-chain or branched $C_{1-24}$ alkylene residue, where $C_{1-24}$ alkylene residue can be unsubstituted, mono-substituted by cyano or halo, or poly-substituted by halo; provided that when two spacer units comprising heteroatoms are linked together the spacer units are linked so that heteroatoms are not directly bonded to each other and when $S^1$ and $S^5$ are linked to another group, they are linked so that two heteroatoms are not directly bonded to each other.

In mesogenic groups of Formula (3), each of c, d, e, and f can independently be an integer ranging from 1 to 20, inclusive; and each of d', e' and f' can independently be 0, 1, 2, 3, and 4, provided that the sum of d'+e'+f' is at least 1.

In mesogenic groups of Formula (3), each of c, d, e, and f can be independently be an integer from 0 to 20, inclusive;

and each of d', e' and f' can independently be 0, 1, 2, 3, or 4, provided that the sum of d'+e'+f' is at least 2.

In mesogenic groups of Formula (3), each of c, d, e, and f can independently be an integer from 0 to 20, inclusive; and each of d', e' and f' can independently be 0, 1, 2, 3, or 4, provided that the sum of d'+e'+f' is at least 3.

In mesogenic groups of Formula (3), each of c, d, e, and f can independently be an integer from 0 to 20, inclusive; and each of d', e' and f' can independently be 0, 1, 2, 3, or 4, provided that the sum of d'+e'+f' is at least 1.

In mesogenic compounds of Formula (1), when the group X is —R, then w can be an integer from 2 to 25, and z can be 1; when the group X is -$L_y$-R, then w can be 1, y can be an integer from 2 to 25, and z can be 1; when the group X is -(L)-R, then w can be an integer from 3 to 26, and z can be 2; when the group X is -$L_w$-Q, then if the group P in Formula (1) is Q, which may be the same or different that the other group Q, w can be 1, and z can be 1 and if the group P is other than the group Q (i.e., P is another group as defined herein), then each w can independently be an integer from 1 to 26, and z can be 1; when the group X is has the structure of Formula (2), (-$L_y$-$M^2$-$L_w$-$P_y$), then w can be 1, y can be an integer from 2 to 25, and z can be 1; when the group X is -(L)$_y$-P, then w can be 1, y can be an integer from 2 to 26, and z can be 1, and -$L_y$- can comprise a linear sequence of at least 25 bonds between the mesogen and P; and when the group X is -$L_w$-[(L)$_w$-P]$_y$, then each w can be independently an integer from 1 to 25, y can be an integer from 2 to 6, and z can be 1.

A mesogenic compound may be a functional mono-mesogenic compound (i.e., a mesogenic compound that contains one mesogenic structure). A functional mono-mesogenic compound may have a structure of Formula (1), wherein the group X is —R, w is an of Formula (1), wherein the group X is -$L_y$-R, w is 1, y is an integer from 2 to 25, and z is 1.

A mesogenic compound may be a functional bi-mesogenic compound (i.e., a mesogenic compound that contains two mesogenic structures, which may be the same or different). For example, a functional bi-mesogenic compound can have a long chain linking group between the two mesogenic units. A functional bi-mesogenic compound may have a structure of Formula (1), wherein the group X is -L-R, w is an integer from 3 to 26, and z is 2. A functional bi-mesogenic compound may have a structure of Formula (1), wherein the group X has the structure of Formula (2):

$$L_y\text{-}M^2\text{-}L_w\text{-}P_y \quad (2)$$

where w is 1, y is an integer from 2 to 25, and z is 1.

A mesogenic compound may be a functional mono-mesogenic compound (i.e., a mesogenic compound that contains one mesogenic structure). For example, a functional mono-mesogenic compound may have a of Formula (1), wherein the group X is -$L_w$-Q and if the group P in Formula (1) is Q, which may be the same or different than the other group Q, w is 1, and z is 1; and if the group P is other than the group Q, then each w is independently and integer from 1 to 26 and z is 1. A mesogenic compound with this structure may contain two groups Q, which may be the same or different, and may be reactive with one or more other monomeric units which may react to form a copolymer. Thus, a mesogenic compound may be a di-functional monomer that may be incorporated into a polymer backbone. That is, the mesogenic group can be incorporated into a polymer backbone and be attached at each end to the formed polymer by the residues of the group(s) Q. The term residue refers to a group that remains after reaction of a reactive group.

A functional mono-mesogenic compound may have a structure of Formula (1), wherein the group X is -$L_y$-P, w is 1, y is an integer from 2 to 25, and z is 1; and -$L_y$- comprises a linear sequence of at least 25 bonds between the mesogen and P. The group -$L_y$- can comprise a linear sequence of at least 50 bonds between the mesogen and P.

A mesogenic compound may have a structure of Formula (1) where the group X is -$L_w$-[(L)$_w$-P]$_y$, each w is independently an integer from 1 to 25, y is an integer from 2 to 6, and z is 1. A mesogenic compound may have, for example, from 3 to 7 reactive groups P.

Mesogenic compounds provided by the present disclosure can provide cured layers that exhibit piezoelectric and/or flexoelectric properties.

Mesogenic compounds provided by the present disclosure can comprise a liquid crystal monomer having the structure of Formula (4) or Formula (5):

$$R\text{-}M\text{-}L_w\text{-}P \quad (4)$$

$$R\text{-}L_y\text{-}M\text{-}L\text{-}P \quad (5)$$

The group P in monomers of Formula (4) and Formula (5) may be a reactive group such as those set forth in the listing for P herein and including groups comprising polymerizable groups, a plurality of reactive groups, or ring opening metathesis polymerization precursors.

The group Q in monomers of Formula (4) and Formula (5) may independently be any of those groups listed for group Q herein. Further, in monomers of Formula (4) and Formula (5), each group -L- may independently be selected from the listing of possible -L- groups set forth herein. In monomers of Formula (4) and Formula (5), the group R may be selected from the listing of possible R groups set forth herein.

The mesogen component $M^1$ and $M^2$ in monomers of Formula (4) and Formula (5) may be a rigid straight rod-like liquid crystal group, a rigid bent rod-like liquid crystal group, or a rigid disc-like liquid crystal group, such as the mesogens set forth herein including those having the structure of Formula (3):

$$-[S^1]_c\text{-}[G^1\text{-}[S^2]_d]_{d'}\text{-}[G^2\text{-}[S^3]_e]_{e'}\text{-}[G^3\text{-}[S^4]_f]_{f'}\text{-}S^5- \quad (3)$$

where $S^1$, $S^2$, $S^3$, $S^4$, $S^5$, $G^1$, $G^2$, $G^3$, c, d, e, f, d', e', and f' are defined herein. In monomers of Formula (4) and Formula (5) w may be an integer ranging from 2 to 25, and y may be an integer ranging from 2 to 25.

Mesogenic compounds provided by the present disclosure include bi-mesogen liquid crystal monomers having the structure of Formula (6) and Formula (7):

$$P\text{-}L\text{-}M\text{-}L_w\text{-}M^2\text{-}L\text{-}P \quad (6)$$

$$P\text{-}L\text{-}M^1\text{-}L_w(\text{-}L\text{-}P)(\text{-}M^2\text{-}L\text{-}R) \quad (7)$$

In mesogenic compounds of Formula (6) and Formula (7), each P may independently comprise a reactive group such as any of those disclose herein including polymerizable groups, multiple reactive groups, or ring opening metathesis polymerization precursors. Each Q may independently comprise any of the groups for Q disclosed herein. In mesogenic compounds of Formula (6) and Formula (7), each L may independently comprise any of the groups for L disclosed herein. In mesogenic compounds of Formula (6) and Formula (7), each R may independently comprise any of the groups for R disclosed herein. The mesogen portion in mesogenic compounds of Formula (6) and Formula (7) may comprise rigid straight rod-like liquid crystal groups, rigid bent rod-like liquid crystal groups, rigid disc-like liquid crystal groups, or a combination of any of the foregoing. Thus, $M^1$ and $M^2$ in compounds of Formula (6) and Formula (7) may independently comprise a mesogenic structure disclosed herein including, for example, the structure of Formula (3):

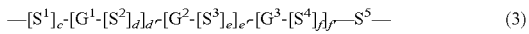

where $S^1$, $S^2$, $S^3$, $S^4$, $S^5$, $G^1$, $G^2$, $G^3$, c, d, e, f, d', e', and f' are defined herein. In mesogenic compounds of Formula (6) and Formula (7) w may be an integer from 2 to 25.

A mesogenic compound can comprise a bi-functional liquid crystal monomer represented by the structure of Formula (8):

$$P\text{-}L_w\text{-}M\text{-}L_w\text{-}Q \tag{8}$$

In mesogenic compounds of Formula (8), P can comprise a reactive group, such as a polymerizable group, a plurality of reactive groups, or ring opening metathesis polymerization precursors. If P is represented by the group Q, then w can be 1; and if P is other than Q, then each w can independently be an integer from 1 to 26.

In mesogenic compounds of Formula (8), each group Q may independently be any of those groups listed for group Q herein. Further, in Formula (8), each group -L- may be independently chosen for each occurrence, which may be the same or different, from the listing of possible -L- groups set forth herein. The mesogen component in Formula (8) may be a rigid straight rod-like liquid crystal group, a rigid bent rod-like liquid crystal group, or a rigid disc-like liquid crystal group, such as the mesogens set forth herein including those having the structure of Formula (3):

where $S^1$, $S^2$, $S^3$, $S^4$, $S^5$, $G^1$, $G^2$, $G^3$, c, d, e, f, d', e', and f' are defined herein.

A mesogenic compound can comprise a liquid crystal monomer having the structure of Formula (9):

$$P\text{-}L\text{-}M\text{-}L_y\text{-}P \tag{9}$$

In mesogenic compounds of Formula (9), each group P may independently comprise a reactive group such as those set forth in the listing for P described herein and including those P groups comprising polymerizable groups, a plurality of reactive groups, or ring opening metathesis polymerization precursors. The group Q may independently be any of those groups listed for Q herein. Further, in Formula (9), each group -L- may be independently chosen for each occurrence, which may be the same or different, from the listing of possible -L- groups set forth herein. The mesogen component in Formula (9) may be a rigid straight rod-like liquid crystal group, a rigid bent rod-like liquid crystal group, or a rigid disc-like liquid crystal group, such as the mesogens set forth herein including those having the structure of Formula (3):

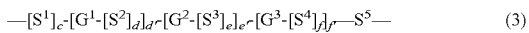

where $S^1$, $S^2$, $S^3$, $S^4$, $S^5$, $G^1$, $G^2$, $G^3$, c, d, e, f, d', e', and f' are defined herein. In addition, in Formula (9), y may be an integer ranging from 2 to 25. In mesogenic compounds of Formula (9), $-L_y-$ can comprise a linear sequence of at least 25 bonds between the mesogen and the group P. In mesogenic compounds of Formula (9), $-L_y-$ may comprise a linear sequence of at least 50 bonds between the mesogen and the group P.

A mesogenic compound can have the structure of Formula (10):

$$P\text{-}L_w\text{-}M\text{-}L_w\text{-}(\text{-}L_w\text{-}P)_y \tag{10}$$

Mesogenic compounds of Formula (10) may comprise from 3 to 7 P groups, wherein each group P in Formula (10) may independently be a reactive group such as those set forth in the listing for P described herein and including those P groups comprising polymerizable groups, a plurality of reactive groups, or ring opening metathesis polymerization precursors. The group Q may independently be any of those groups listed for group Q herein. In compounds of Formula (10), each group -L- may be independently chosen for each occurrence, which may be the same or different, from the listing of possible -L- groups set forth herein. The mesogen component in Formula (10) may be a rigid straight rod-like liquid crystal group, a rigid bent rod-like liquid crystal group, or a rigid disc-like liquid crystal group, such as the mesogens set forth herein including those having the structure of Formula (3):

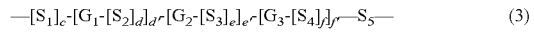

where $S^1$, $S^2$, $S^3$, $S^4$, $S^5$, $G^1$, $G^2$, $G^3$, c, d, e, f, d', e', and f' are defined herein. In compounds of Formula (12), each w may independently be an integer from 1 to 25, and y may be an integer from 2 to 6.

Mesogenic compounds of Formula (1) and (4)-(10) can comprise a long flexible linking group between one or more portions of the compound. For example, linking groups $-L_y-$ and/or $-L_w-$ and in certain cases the group -L- (for example, when -L- comprises at least 25 linear bonds) may comprise a long flexible linking group comprising a long linear sequence of chemical bonds, ranging from 25 to 500 chemical bonds in length, between the two groups linked by the linking group. A linking group may comprise a long linear sequence of chemical bonds ranging from 30 to 500 chemical bonds in length between the two groups. A linking group may comprise a long linear sequence of chemical bonds ranging from 50 to 500 chemical bonds in length between the two groups. As used with reference to the linking group, the chemical bonds in the linear sequence between the groups linked by the linking group may be covalent or polar covalent chemical bonds, such as covalent or polar covalent σ-bonds and may also include one or more π-bonds (although the π-bonds are not included when calculating the length of chemical bonds in the linear sequence). Further, it will be understood by those skilled in the art that the linking group can also comprise those intervening atoms through which the linear sequence of bonds are associated.

Polymerizable mesogenic monomers can comprise a compound of Formula (1):

$$P\text{-}(L)_w\text{-}(M^1\text{-}X)_z \tag{1}$$

wherein, a) each —X is independently:
  i) a group —R;
  ii) a group represented by $-(L)_y\text{-}R$;
  iii) a group represented by $-(L)\text{-}R$;
  iv) a group represented by $-(L)_w\text{-}Q$;
  v) a group represented by a moiety of Formula (2):

$$-(L)^y\text{-}M^2\text{-}(L)_w\text{-}P \tag{2}$$

vi) a group represented by -(L)$_y$-P; or
vii) a group represented by -(L)$_w$-[(L)$_w$-P]$_y$;
b) P comprises a reactive group;
c) Q is selected from hydroxyl, amine, alkenyl, alkynyl, azido, silyl, silylhydride, oxy(tetrahydro-2H-pyran-2-yl), thiol, isocyanato, thioisocyanato, acryloxy, methacryloxy, 2-(acryloxy)ethylcarbamyl, 2-(methacryloxy)ethylcarbamyl, aziridinyl, allylcarbonate, epoxy, carboxylic acid, carboxylic ester, amide, carboxylic anhydride, and acyl halide;
d) each L is independently selected from a single bond, a polysubstituted, monosubstituted, unsubstituted or branched spacer independently comprising aryl, (C$_{1-30}$)alkyl, (C$_{1-30}$)alkylcarbonyloxy, (C$_{1-30}$)alkylamino, (C$_{1-30}$)alkoxy, (C$_{1-30}$)perfluoroalkyl, (C$_{1-30}$) perfluoroalkoxy, (C$_{1-30}$)alkylsilyl, (C$_{1-30}$)dialkylsiloxyl, (C$_{1-30}$)alkylcarbonyl, (C$_{1-30}$)alkoxycarbonyl, (C$_{1-30}$)alkylcarbonylamino, (C$_{1-30}$)alkylaminocarbonyl, (C$_{1-30}$)alkylcarbonate, (C$_{1-30}$)alkylaminocarbonyloxy, (C$_{1-30}$)alkylaminocarbonylamino, (C$_{1-30}$)alkylurea, (C$_{1-30}$)alkylthiocarbonylamino, (C$_{1-30}$) alkylaminocarbonylthio, (C$_{2-30}$)alkene, (C$_{1-30}$) thioalkyl, (C$_{1-30}$)alkylsulfone, or (C$_{1-30}$)alkylsulfoxide, wherein each substituent is independently chosen from (C$_{1-5}$)alkyl, (C$_{1-5}$)alkoxy, fluoro, chloro, bromo, cyano, (C$_{1-5}$)alkanoate ester, isocyanato, thioisocyanato, and phenyl;
e) R is selected from hydrogen, C$_{1-18}$ alkyl, C$_{1-18}$ alkoxy, C$_{1-18}$ alkoxycarbonyl, C$_{3-10}$ cycloalkyl, C$_{3-10}$ cycloalkoxy, poly(C$_{1-18}$ alkoxy), and a straight-chain or branched C$_{1-18}$ alkyl group that is unsubstituted or substituted with cyano, fluoro, chloro, bromo, or C$_{1-18}$ alkoxy, or poly-substituted with fluoro, chloro, or bromo; and
f) each of M$^1$ and M$^2$ independently comprise a rigid straight rod-like liquid crystal group, a rigid bent rod-like liquid crystal group, or a rigid disc-like liquid crystal group;
wherein,
w is an integer from 1 to 26;
y is an integer from 2 to 25; and
z is 1 or 2;
provided that when,
X is R, then w is an integer from 2 to 25, and z is 1;
X is -(L)$_y$-R, then w is 1, y is an integer from 2 to 25, and z is 1;
X is -(L)-R, then w is an integer from 3 to 26, and z is 2;
X is -(L)$_w$-Q; then if P is represented by the group Q, then w is 1, and z is 1; and if P is other than the group Q, then each w is independently an integer from 1 to 26 and z is 1;
X is a moiety of Formula (2), -(L)$_y$-M$^2$-(L)$_w$-P, then w is 1, y is an integer from 2 to 25, and z is 1;
X is -(L)$_y$-P, then w is 1, y is an integer from 2 to 25, and z is 1 and -(L)$_y$- comprises a linear sequence of at least 25 bonds between the mesogen and P; and
X is -(L)$_w$-[(L)$_w$-P]$_y$, then each w is independently an integer from 1 to 25, y is an integer from 2 to 6, and z is 1.

Dielectric compositions provided by the present disclosure can comprise a single mesogenic compound or a combination of mesogenic compounds.

The mesogenic compounds can be polymerizable and have functional groups reactive with functional groups of other mesogenic compounds in the dielectric composition.

Reactive groups of the mesogenic monomers can be selected as appropriate for any suitable curing chemistry. For example, a suitable curing chemistry can comprise the reaction between thiol groups, and epoxy, alkenyl, or Michael acceptor groups.

The mesogenic compounds can be photopolymerizable such that the mesogenic compounds comprise functional groups that are reactive when the composition comprising the mesogenic compounds is exposed to UV radiation. For example, photopolymerizable mesogenic compounds can comprise terminal acrylate or methacrylate groups. A photopolymerizable mesogenic compound can comprise a single terminal (meth)acrylate group or can comprise two terminal (meth)acrylate groups. Photopolymerizable groups can also include thiol and alkenyl groups. Photopolymerizable mesogenic compounds having a single reactive group are referred to as monofunctional photopolymerizable mesogenic compounds, and photopolymerizable mesogenic compounds having two reactive groups are referred to as difunctional photopolymerizable mesogenic compounds.

A suitable curing chemistry includes urethane and urea chemistries where the reactive groups can be isocyanate, amine, and hydroxyl groups.

The mesogenic compounds can be thermally-polymerizable such that the mesogenic compounds comprise functional groups that are reactive when the composition comprising the mesogenic compounds is exposed to heat such as a temperature greater than 30° C., greater than 40° C., greater than 50° C., or greater than 60° C. For example, thermally-polymerizable mesogenic compounds can comprise terminal acrylate or methacrylate groups. A thermally-polymerizable mesogenic compound can comprise a single terminal (meth)acrylate group or can comprise two terminal (meth)acrylate groups. Thermally-polymerizable groups can also include thiol and alkenyl groups. thermally-polymerizable mesogenic compounds having a single reactive group are referred to as monofunctional thermally-polymerizable mesogenic compounds, and thermally-polymerizable mesogenic compounds having two reactive groups are referred to as difunctional thermally-polymerizable mesogenic compounds.

Compositions provided by the present disclosure can comprise a mol % ratio of difunctional to monofunctional polymerizable mesogenic compounds, for example, from 20 to 60, from 25 to 55, from 30 to 50, or from 35 to 45.

Mesogenic compounds provided by the present disclosure can have a molecular weight, for example, from 300 Daltons to 3,000 Daltons, from 300 Daltons to 2,000 Daltons, from 300 Daltons to 1,500 Daltons, from 300 Daltons to 1,000 Daltons, or from 400 Daltons to 800 Daltons, where molecular weight can be determined by gel permeation chromatography using polystyrene standards.

Specific examples of suitable mesogenic compounds include:

Compound (1)

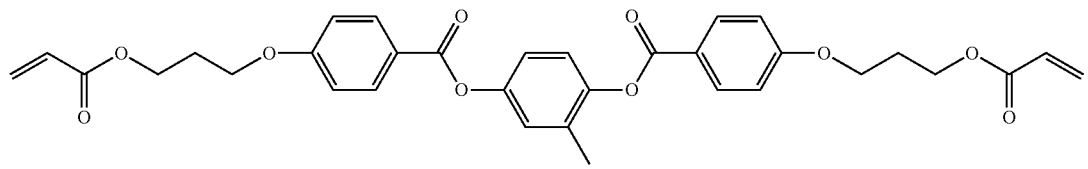

2-methyl-1,4-phenylene bis(4-(3-(acryloyloxy)propoxy)benzoate)

Compound (2)

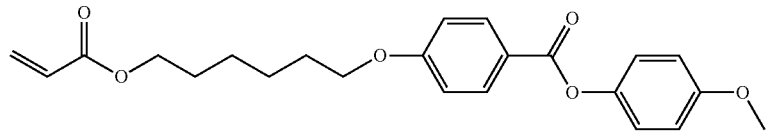

4-methoxyphenyl 4-((6-(acryloyloxy)hexyl)oxy)benzoate

Compound (3)

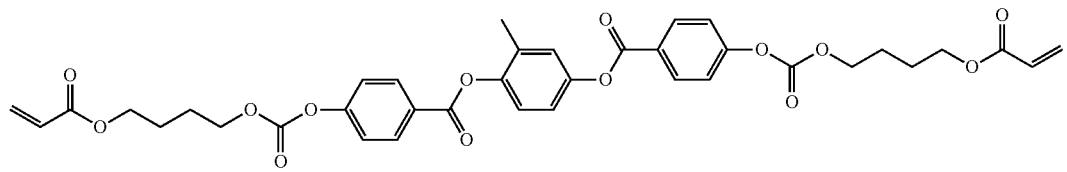

2-methyl-1,4-phenylene bis(4-(((4-(acryloyloxy)butoxy)carbonyl)oxy)benzoate)

Compound (4)

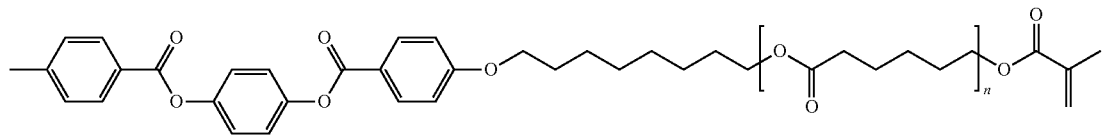

4-((4-((8-((6-(methacryloyloxy)hexanoyl)oxy)octyl)oxy)benzoyl)oxy)phenyl 4-methylbenzoate
(n = 8)

Compound (5)

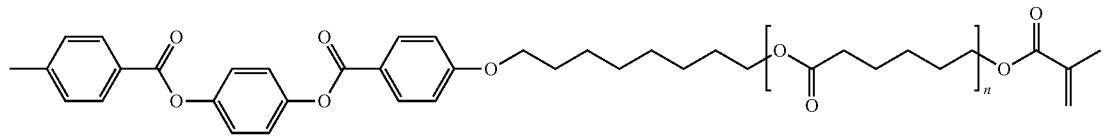

4-((4-((8-((6-(methacryloyloxy)hexanoyl)oxy)octyl)oxy)benzoyl)oxy)phenyl 4-methylbenzoate
(n = 3)

Compound (6)

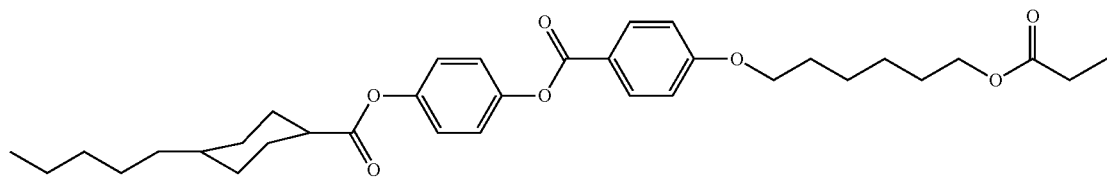

4-((4-pentylcyclohexane-1-carbonyl)oxy)phenyl 4-((6-(acryloyloxy)hexyl)oxy)benzoate Compound (7)

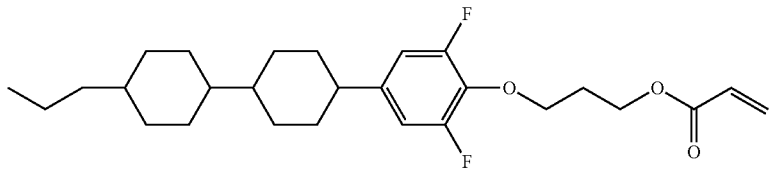

3-(2,6-difluoro-4-(4'-propyl-[1,1'-bi(cyclohexan)]-4-yl)phenoxy)propyl acrylate

Dielectric compositions can comprise mesogenic Compounds (1)-(7), or a combination of any of the foregoing. Other examples of suitable mesogenic compounds include the compounds disclosed in U.S. Application Publication No. 2010/0014010, which is incorporated by reference in its entirety, including any of those disclosed in Table 1 (U.S. Application Publication No. 2010/0014010) having at least one (meth)acrylate group, such as:

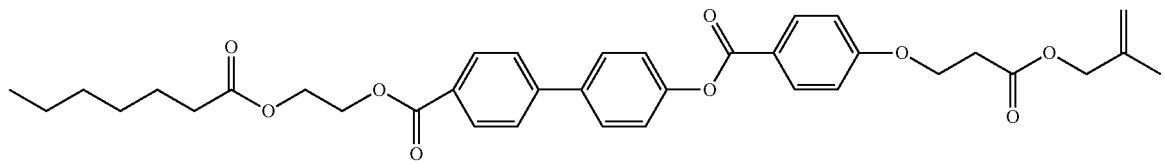

1,12-bis{2-(4-(4-(4-(3-(methacryloyloxy)propyloxy)benzoyloxy)phenyl)benzoyloxy)ethyloxy)
dodecyl-1,12-dione

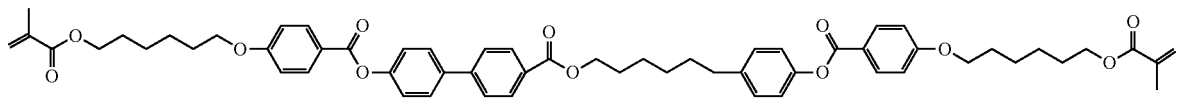

1,12-bis(6-(4-(4-(4-(6-(methacryloyloxy)hexyloxy)benzoyloxy)phenyl)benzoyloxy)hexyloxy)
dodecyl-1,12-dione

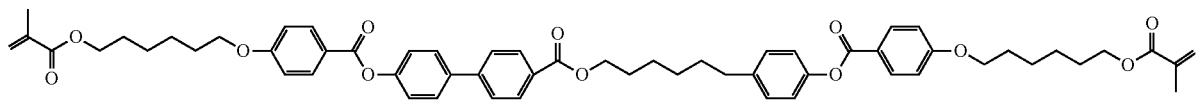

1,10-bis(6-(4-(4-(4-(6-(methacryloyloxy)hexyloxy)benzoyloxy)phenyl)benzoyloxy)hexyloxy)
2,2,3,3,4,4,5,5,6,6,7,7,8,8,9,9-hexadecafluorodecyl-1,10-dione

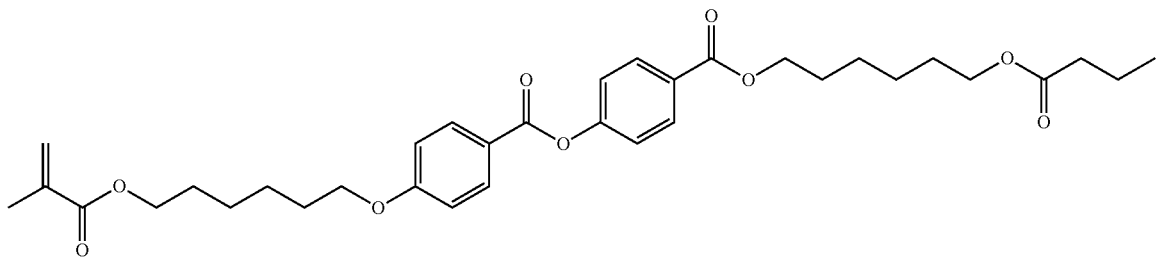

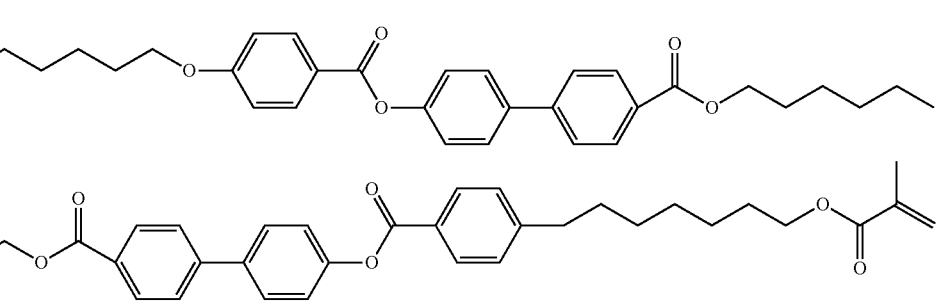

1-{3-(4-(3-(4-(6-(4(4-(4-(6-methacryloyloxyhexyloxy)benzoyloxy)phenyl)benzoyloxy)hexyloxy)-
4-oxobutoyloxy)propyloxy)benzoyloxy)propyloxy}-4-{(6-(4(4-(4-(6-methacryloyloxyhexyloxy)
benzoyloxy)phenyl)benzoyloxy)hexyloxy)}-butane-1,4-dione

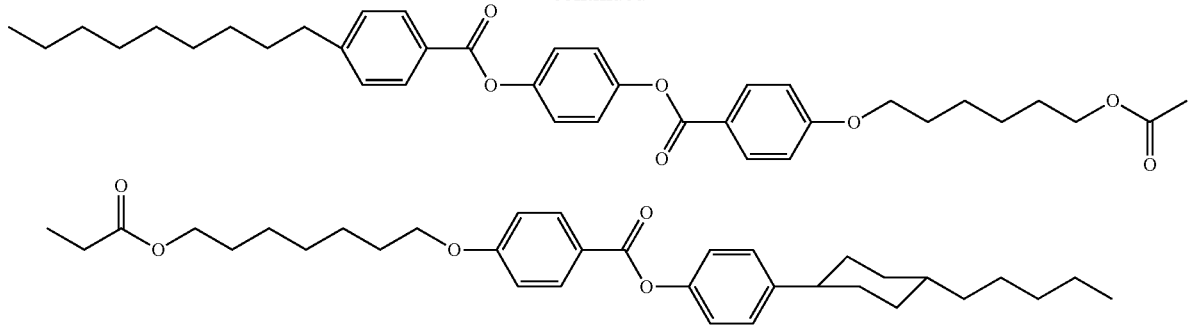

6-(tetrahydro-2H-pyran-2-yloxy)hexyl 2,5-bix(8-(3-(8-(4-(4-(trans-4-pentylcyclohexyl)
phenoxylcarbonyl(phenoxy)octyloxycarbonyl)propionyloxy)octyloxy)benzoate

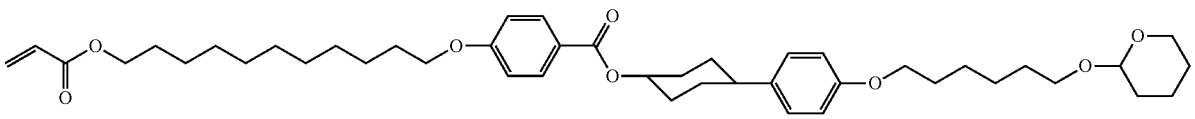

1-(11-(4-(trans-4-(4-(6-(1-(tetrahydro-2H-pyran-2-yloxy)hexyloxy)phenyl)
cyclohexyloxycarbonyl)phenoxy)undecanoxy)prop-2-en-1-one

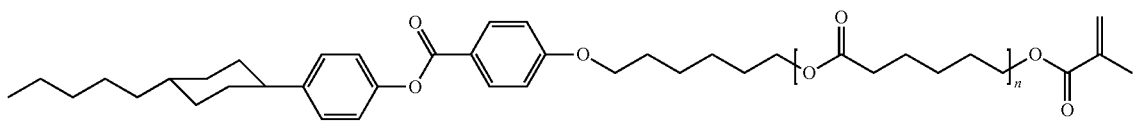

n ~ 6.5
1-(6-(6-(6-(6-(6-(6-(6-(4-(4-(trans-4-pentylcyclohexyl)phenoxycarbonyl)phenoxy)hexyloxy)-6-
oxohexyloxy)-6-oxohexyloxy)-6-oxohexyloxy)-6-oxohexyloxy)-6-oxohexyloxy)-
2-methylprop-2-en-1-one

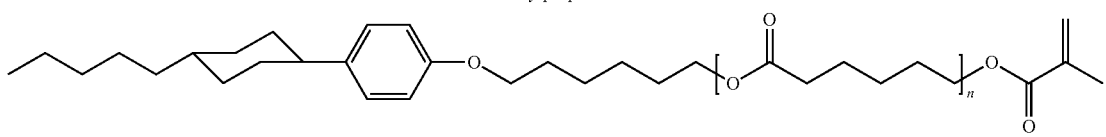

1-(6-(6-(6-(6-(4-(4-(trans-4-pentylcyclohexyl)phenoxy)hexyloxy)-6-
oxohexyloxy)-6-oxohexyloxy)-6-oxohexyloxy)-2-methylprop-2-en-1-one

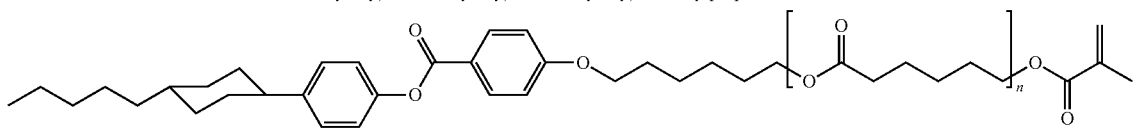

n ~ 7.5
1-(6-(6-(6-(6-(6-(6-(6-(6-(4-(4-(trans-4-pentylcyclohexyl)phenoxycarbonyl)phenoxy)hexyloxy)-6-
oxohexyloxy)-6-oxohexyloxy)-6-oxohexyloxy)-6-oxohexyloxy)-6-oxohexyloxy)-
6-oxohexyloxy)-2-methylprop-2-en-1-one

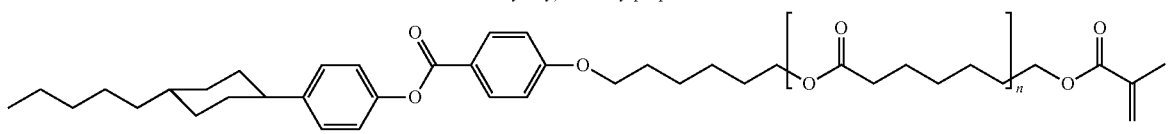

n ~ 4.5
1-(5-(5-(5-(5-(6-(4-(4-(trans-4-pentylcyclohexyl)phenoxycarbonyl)phenoxy)hexyloxy)-5-
oxopentyloxy)-5-oxopentyloxy)-5-oxopentyloxy)-5-oxopentyloxy)-2-methylprop-2-en-1-one

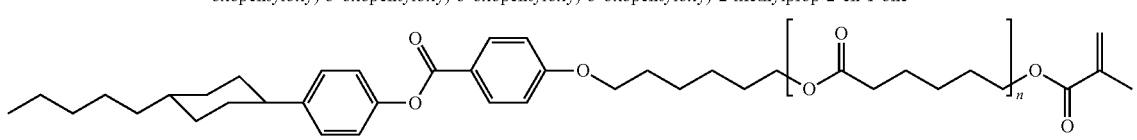

n ~ 2.3
1-(6-(6-(6-(6-(4-(4-(trans-4-pentylcyclohexyl)phenoxycarbonyl)phenoxy)hexyloxy)-6-
oxohexyloxy)-6-oxohexyloxy)-6-oxohexyloxy)-2-methylprop-2-en-1-one -continued

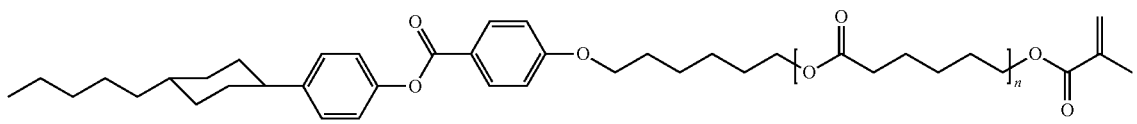

n ~ 11.0
1-(6-(6-(6-(6-(6-(6-(6-(6-(6-(6-(6-(4-(4-(trans-4-pentylcyclohexyl)phenoxycarbonyl)phenoxy)hexyloxy)-6-oxohexyloxy)-6-oxohexyloxy)-6-oxohexyloxy)-6-oxohexyloxy)-6-oxohexyloxy)-6-oxohexyloxy)-6-oxohexyloxy)-6-oxohexyloxy)-6-oxohexyloxy)-2-methylprop-2-en-1-one

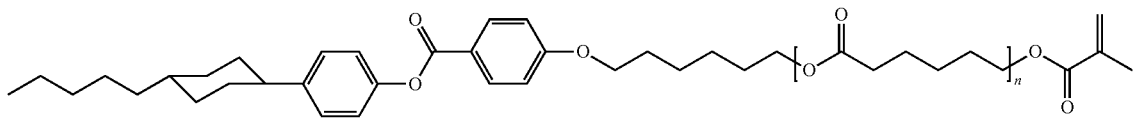

n ~ 15.0
1-(6-(6-(6-(6-(6-(6-(6-(6-(6-(6-(6-(6-(6-(6-(6-(4-(4-(trans-4-pentylcyclohexyl)phenoxycarbonyl)phenoxy)hexyloxy)-6-oxohexyloxy)-6-oxohexyloxy)-6-oxohexyloxy)-6-oxohexyloxy)-6-oxohexyloxy)-6-oxohexyloxy)-6-oxohexyloxy)-6-oxohexyloxy)-6-oxohexyloxy)-6-oxohexyloxy)-6-oxohexyloxy)-6-oxohexyloxy)-6-oxohexyloxy)-2-methylprop-2-en-1-one

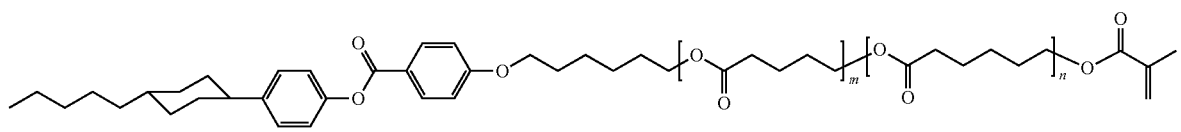

m + n ~ 8.0
1-(6-(5-(5-(6-(5-(6-(5-(6-(6-(4-(4-(trans-4-pentylcyclohexyl)phenoxycarbonyl)phenoxy)hexyloxy)-6-oxohexyloxy)-5-oxopentyloxy)-6-oxohexyloxy)-5-oxopentyloxy)-6-oxohexyloxy)-5-oxopentyloxy)-5-oxopentyloxy)-6-oxohexyloxy-2-methylprop-2-en-1-one

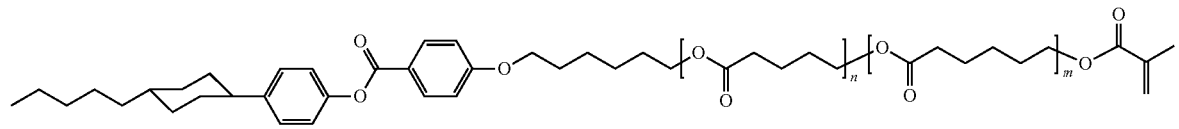

m + n ~ 3
1-(6-(5-(6-(6-(4-(4-(trans-4-pentylcyclohexyl)phenoxycarbonyl)phenoxy)hexyloxy)-6-oxohexyloxy)-5-oxopentyloxy)-6-oxohexyloxy)-2-methylprop-2-en-1-one

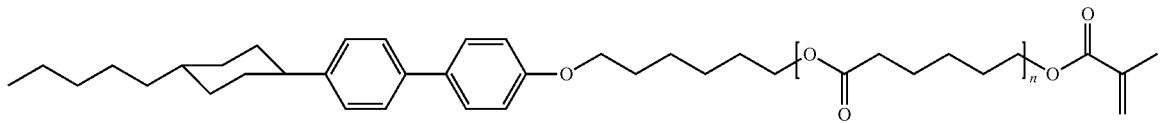

n ~ 3.0
1-(6-(6-(6-(6-(4-(4-(trans-4-pentylcyclohexyl)phenoxycarbonyl)phenoxy)hexyloxy)-6-oxohexyloxy)-6-oxohexyloxy)-6-oxohexyloxy)-2-methylprop-2-en-1-one

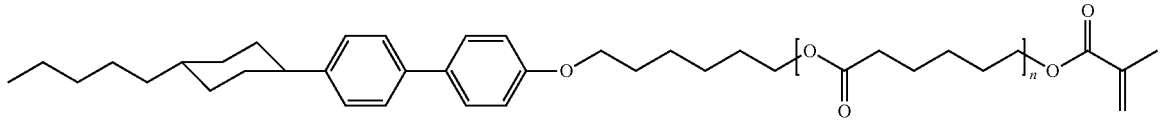

n ~ 8
1-(6-(6-(6-(6-(6-(6-(6-(6-(6-(4-(4-(trans-4-pentylcyclohexyl)phenyl)phenoxy)hexyloxy)-6-oxohexyloxy)-6-oxohexyloxy)-6-oxohexyloxy)-6-oxohexyloxy)-6-oxohexyloxy)-6-oxohexyloxy)-6-oxohexyloxy)-6-oxohexyloxy)-2-methylprop-2-en-1-one

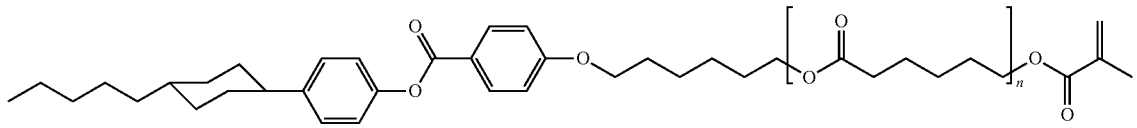

n ~ 8
1-(6-(6-(6-(6-(6-(6-(6-(6-(6-(6-(4-(4-(trans-4-pentylcyclohexyl)phenyloxycarbonyl)phenoxy)hexyloxy)-6-oxohexyloxy)-6-oxohexyloxy)-6-oxohexyloxy)-6-oxohexyloxy)-6-oxohexyloxy)-6-oxohexyloxy)-6-oxohexyloxy)-6-oxohexyloxy)-2-methylprop-2-en-1-one

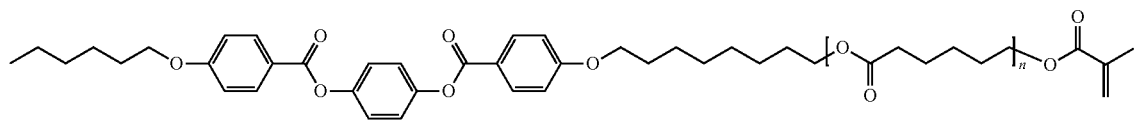

n ~ 7
1-(6-(6-(6-(6-(6-(6-(6-(8-(4-(4-(4-hexyloxybenzoyloxy)phenoxycarbonyl)phenoxy)octyloxy)-6-oxohexyloxy)-6-oxohexyloxy)-6-oxohexyloxy)-6-oxohexyloxy)-6-oxohexyloxy)-6-oxohexyloxy)-6-oxohexyloxy)-2-methylprop-2-en-1-one

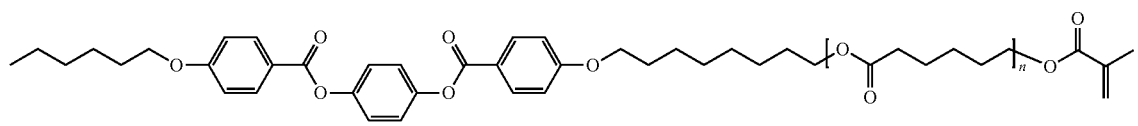

n ~ 3.0
1-(6-(6-(6-(8-(4-(4-(4-hexyloxybenzoyloxy)phenoxycarbonyl)phenoxy)octyloxy)-6-oxohexyloxy)-6-oxohexyloxy)-6-oxohexyloxy)-2-methylprop-2-en-1-one

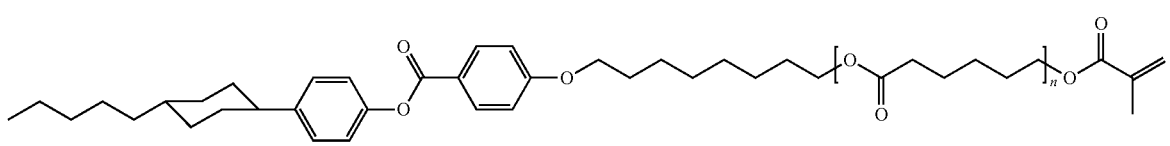

n ~ 9.0
1-(6-(6-(6-(6-(6-(6-(6-(6-(6-(6-(4-(4-(trans-4-pentylcyclohexyl)phenyloxycarbonyl)phenoxy)hexyloxy)-6-oxohexyloxy)-6-oxohexyloxy)-6-oxohexyloxy)-6-oxohexyloxy)-6-oxohexyloxy)-6-oxohexyloxy)-6-oxohexyloxy)-6-oxohexyloxy)-2-methylprop-2-en-1-one

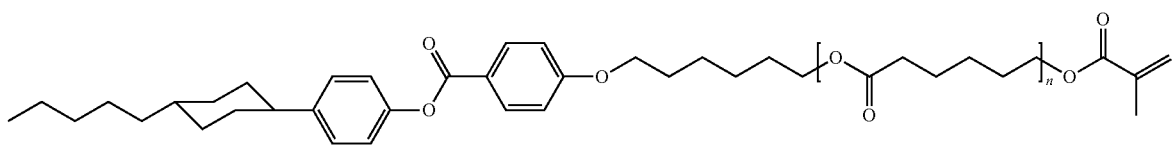

n ~ 1.8
1-(6-(6-(6-(4-(4-(trans-4-pentylcyclohexyl)phenyloxycarbonyl)phenoxy)hexyloxy)-6-oxohexyloxy)-6-oxohexyloxy)-2-methylprop-2-en-1-one

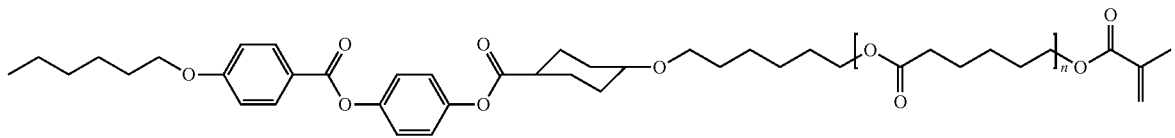

n ~ 9.6
1-(6-(6-(6-(6-(6-(6-(6-(6-(6-(6-(trans-4-(4-(4-hexyloxybenzoyloxy)phenoxycarbonyl)cyclohexyloxy)hexyloxy)-6-oxohexyloxy)-6-oxohexyloxy)-6-oxohexyloxy)-6-oxohexyloxy)-6-oxohexyloxy)-6-oxohexyloxy)-6-oxohexyloxy)-6-oxohexyloxy)-2-methylprop-2-en-1-one

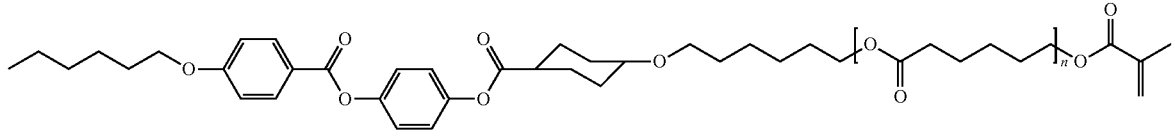

n ~ 3.2
1-(6-(6-(6-(6-(trans-4-(4-(4-hexyloxybenzoyloxy)phenoxycarbonyl)cyclohexyloxy)hexyloxy)-6-oxohexyloxy)-6-oxohexyloxy)-6-oxohexyloxy)-2-methylprop-2-en-1-one

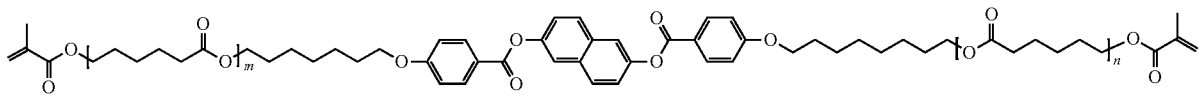

m + n ~ 5.0
2,8-di{4-(6-(6-(6-(6-(6-(methacryloyloxy)hexanoyloxy)hexanoyloxy)hexanoyloxy)hexanoyloxy)hexanoyloxy)benzoyloxy}napthalene -continued

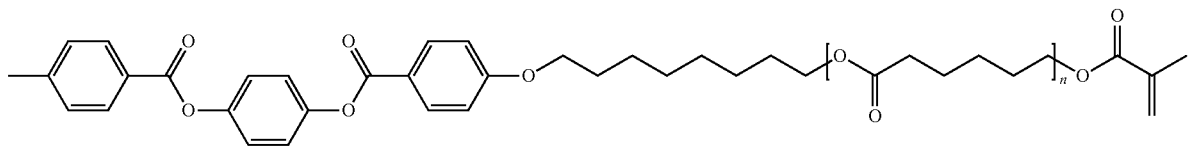

n ~ 8
1-(6-(6-(6-(6-(6-(6-(6-(6-(8-(4-(4-methylbenzoyloxy)phenyloxycarbonyl)phenoxy)octyloxy)-6-
oxohexyloxy)-6-oxohexyloxy)-6-oxohexyloxy)-6-oxohexyloxy)-6-oxohexyloxy)-6-oxohexyloxy)-
6-oxohexyloxy)-2-methylprop-2-en-1-one

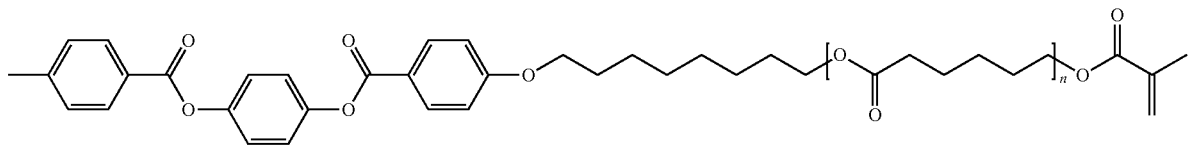

n ~ 3
1-(6-(6-(6-(6-(8-(4-(4-methylbenzoyloxy)phenyloxycarbonyl)phenoxy)octyloxy)-6-
oxohexyloxy)-6-oxohexyloxy)-6-oxohexyloxy)-2-methylprop-2-en-1-one

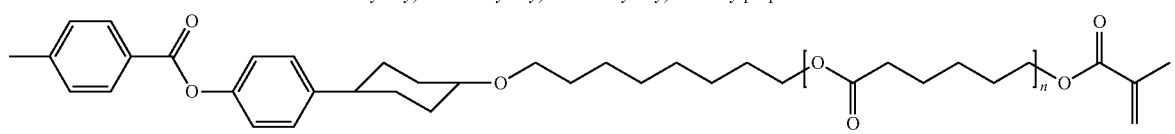

n ~ 3.3
1-(6-(6-(6-(6-(trans-4-(4-(4-methylbenzoyloxy)phenyl)cyclohexyloxyl)hexyloxy)-6-
oxohexyloxy)-6-oxohexyloxy)-6-oxohexyloxy)-2-methylprop-2-en-1-one

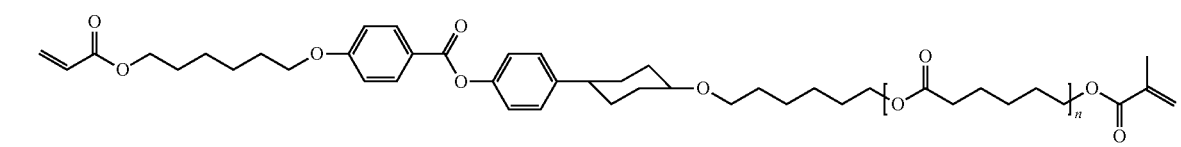

n ~ 3.5
1-(6-(6-(6-(6-(trans-4-(4-(4-(6-acryloyloxyhexyloxy)benzoyloxy)phenyl)cyclohexyloxy)
hexyloxy)-6-oxohexyloxy)-6-oxohexyloxy)-6-oxohexyloxy)-2-methylprop-2-en-1-one

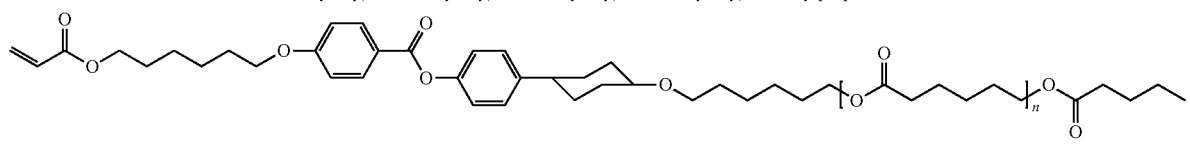

n ~ 5.0
1-(6-(6-(6-(6-(6-(trans-4-(4-(4-(6-acryloyloxyhexyloxy)benzoyloxy)phenyl)cyclohexyloxy)
hexyloxy)-6-oxohexyloxy)-6-oxohexyloxy)-6-oxohexyloxy)-6-oxohexyloxy)
pentan-1-one

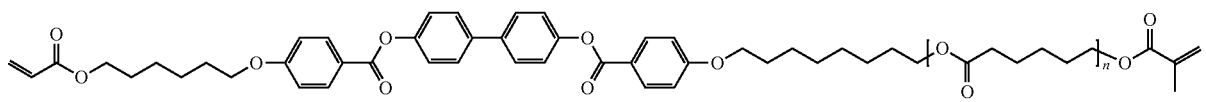

n ~ 2.1
1-(6-(6-(6-(4-(4-(4-(4-(6-acryloyloxyhexyloxy)benzoyloxy)phenyl)phenyloxy)octyloxy)-6-
oxohexyloxy)-6-oxohexyloxy)-2-methylprop-2-en-1-one

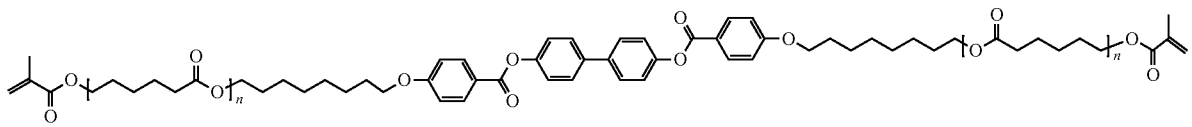

each n ~ 1
1-(6-(8-(4-(4-(4-(4-(8-(6-methacryloyloxy)hexyloyloxy)octyloxy)benzoyloxy)phenyl)
phenyloxycarbonyl)phenyloxy)octyloxy)-6-oxohexyloxy)-2-methylprop-2-en-1-one -continued

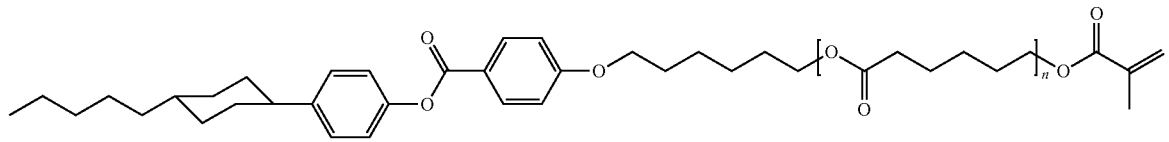

n ~ 8.15
1-(6-(6-(6-(6-(6-(6-(6-(6-(6-(4-(4-(trans-4-pentylcyclohexyl)phenoxycarbonyl)
phenoxy)hexyloxy)-6-oxohexyloxy)-6-oxohexyloxy)-6-oxohexyloxy)-6-oxohexyloxy)-6-oxohexyloxy)-6-oxohexyloxy)-6-oxohexyloxy)-2-
methylprop-2-en-1-one

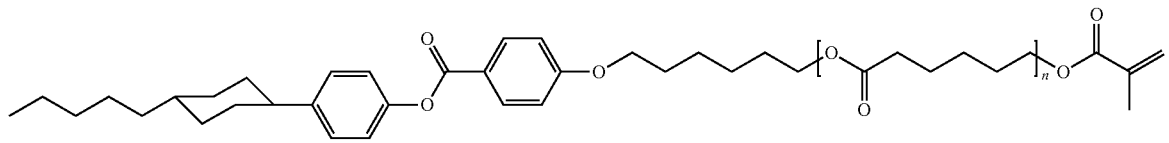

n ~ 3.15
1-(6-(6-(6-(6-(4-(4-(trans-4-pentylcyclohexyl)phenoxycarbonyl)phenoxy)hexyloxy)-6-
oxohexyloxy)-6-oxohexyloxy)-6-oxohexyloxy)-2-methylprop-2-en-1-one

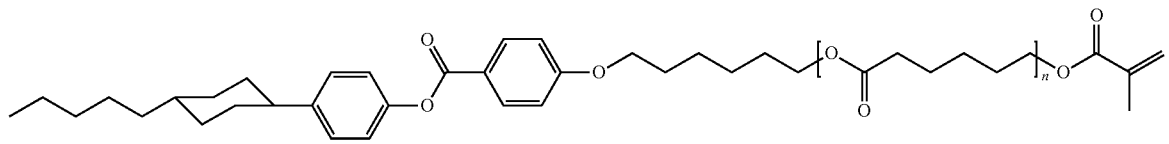

n ~ 11
1-(6-(6-(6-(6-(6-(6-(6-(6-(6-(6-(6-(6-(4-(4-(trans-4-pentylcyclohexyl)phenoxycarbonyl)phenoxy)hexyloxy)-6-
oxohexyloxy)-6-oxohexyloxy)-6-oxohexyloxy)-6-oxohexyloxy)-6-oxohexyloxy)-6-oxohexyloxy)-
6-oxohexyloxy)-6-oxohexyloxy)-6-oxohexyloxy)-6-oxohexyloxy)-2-methylprop-2-en-1-one

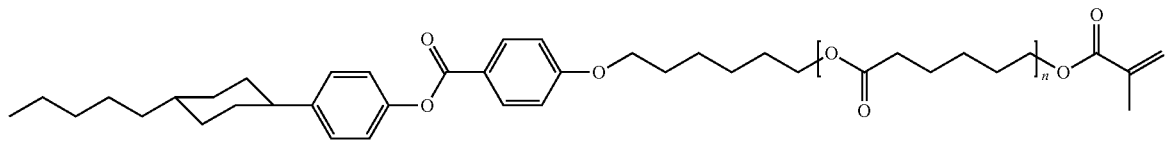

n ~ 6
1-(6-(6-(6-(6-(6-(6-(6-(4-(4-(trans-4-pentylcyclohexyl)phenoxycarbonyl)phenoxy)hexyloxy)-6-
oxohexyloxy)-6-oxohexyloxy)-6-oxohexyloxy)-6-oxohexyloxy)-6-oxohexyloxy)-2-methylprop-2-en-1-one

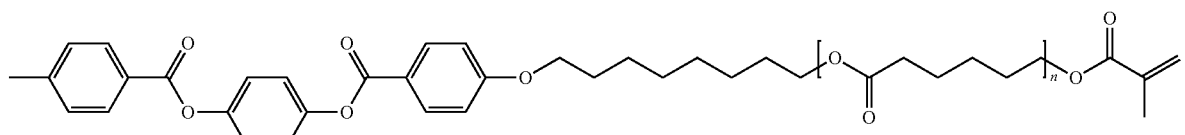

n ~ 1.28
1-(6-(6-(8-(4-(4-methylbenzoyloxy)phenyloxycarbonyl)phenoxy)octyloxy)-6-
oxohexyloxy)-2-methylprop-2-en-1-one

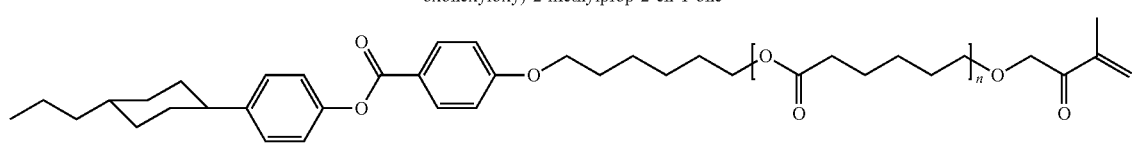

n ~ 6.4
1-(5-(5-(5-(5-(5-(5-(6-(4-(4-(trans-4-propylcyclohexyl)phenyloxycarbonyl)phenoxy)hexyloxy)-5-
oxopentyloxy)-5-oxopentyloxy)-5-oxopentyloxy)-5-oxopentyloxy)-5-oxopentyloxy)-2-methylprop-2-en-1-one

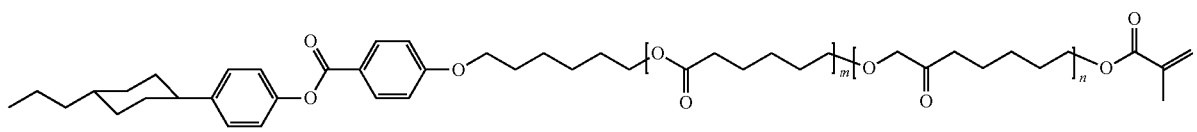

m + n ~ 7.1
1-(5-(5-(6-(5-(6-(5-(6-(6-(4-(4-(trans-4-propylcyclohexyl)phenoxycarbonyl)phenoxy)hexyloxy)-6-
oxohexyloxy)-5-oxopentyloxy)-6-oxohexyloxy)-5-oxopentyloxy)-6-oxohexyloxy)-5-oxopentyloxy)-2-methylprop-2-en-1-one

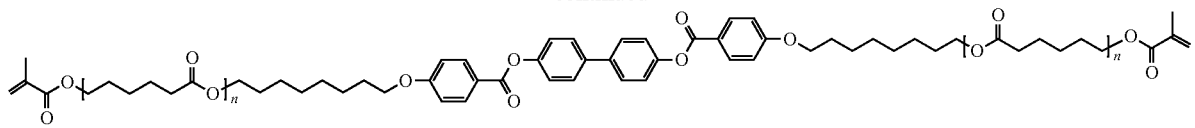

each n ~ 1.0
1-(6-(8-(4-(4-(4-(4-(8-(6-methacryloyloxy)hexyloyloxy)octyloxy)benzoyloxy)phenyl)
phenyloxycarbonyl)phenyloxy)octyloxy)-6-oxohexyloxy)-2-methylprop-2-en-1-one

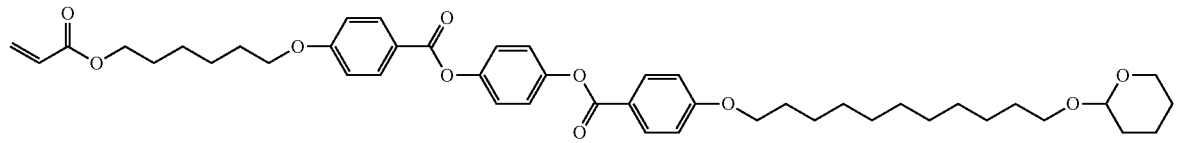

1-(11-(4-(4-(4-(6-(11-(tetrahydro-2H-pyran-2-yloxy)undecanyloxy)benzoyloxy)phenoxycarbonyl)
phenoxy)hexyloxy)prop-2-en-1-one

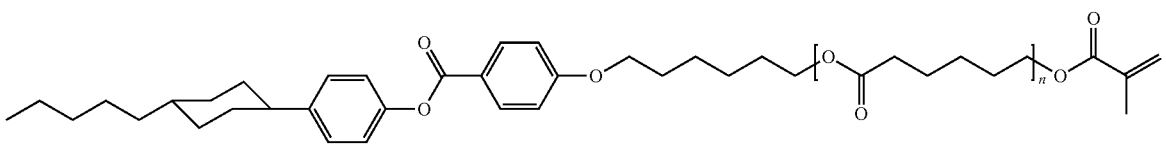

n ~ 2.1
1-(6-(6-(6-(4-trans-4-pentylcyclohexyl)phenoxycarbonyl)phenoxy)hexyloxy)-6-
oxohexyloxy)-6-oxohexyloxy)-2-methylprop-2-en-1-one

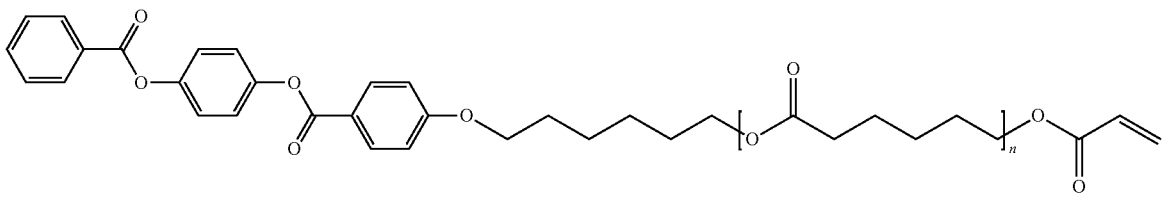

n ~ 1.7
1-(6-(6-(6-(4-(4-benzoyloxyphenoxycarbonyl)phenoxy)hexyloxy)-6-oxohexyloxy)-6-oxohexyloxy)
prop-2-en-1-one

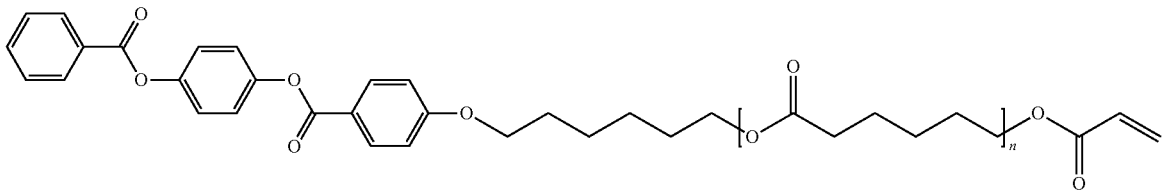

n ~ 7
1-(6-(6-(6-(6-(6-(6-(6-(6-(4-(4-benzoyloxyphenoxycarbonyl)phenoxy)hexyloxy)-6-oxohexyloxy)-6-oxohexyloxy)-6-oxohexyloxy)-
6-oxohexyloxy)-6-oxohexyloxy)-6-oxohexyloxy)prop-2-en-1-one

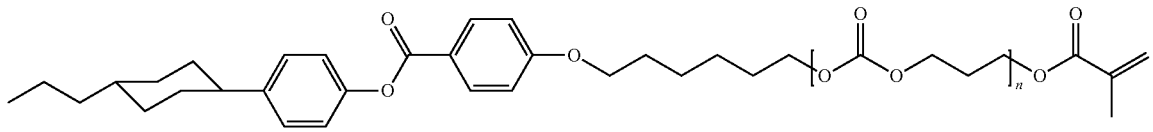

n ~ 1.7
1-(3-(3-(6-(4-(trans-4-propylcyclohexyl)phenoxycarbonyl)phenoxy)hexyloxy)-3-
carbonyloxypropyloxy)-3-carbonyloxypropyloxy)-2-methylprop-2-en-1-one

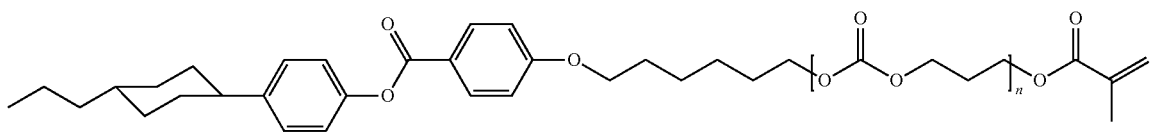

n ~ 3.5
1-(3-(3-(3-(3-(6-(4-(trans-4-propylcyclohexyl)phenoxycarbonyl)phenoxy)hexyloxy)-3-
carbonyloxypropyloxy)-3-carbonyloxypropyloxy)-3-carbonyloxypropyloxy)-3-carbonyloxypropyloxy)-2-methylprop-2-en-1-one -continued

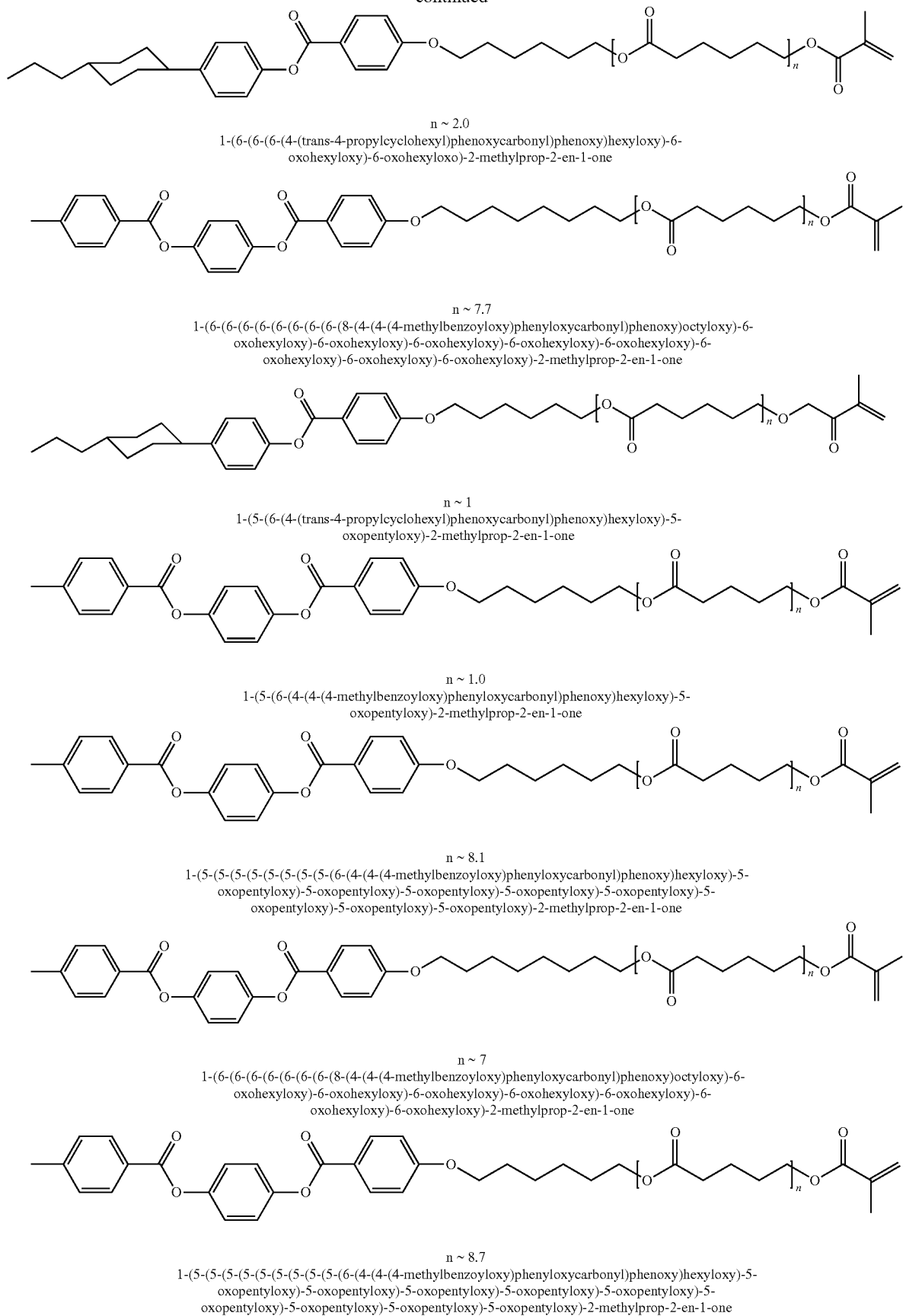

n ~ 2.0
1-(6-(6-(6-(4-(trans-4-propylcyclohexyl)phenoxycarbonyl)phenoxy)hexyloxy)-6-
oxohexyloxy)-6-oxohexyloxo)-2-methylprop-2-en-1-one n ~ 7.7
1-(6-(6-(6-(6-(6-(6-(6-(6-(8-(4-(4-(4-methylbenzoyloxy)phenyloxycarbonyl)phenoxy)octyloxy)-6-
oxohexyloxy)-6-oxohexyloxy)-6-oxohexyloxy)-6-oxohexyloxy)-6-oxohexyloxy)-6-
oxohexyloxy)-6-oxohexyloxy)-2-methylprop-2-en-1-one n ~ 1
1-(5-(6-(4-(trans-4-propylcyclohexyl)phenoxycarbonyl)phenoxy)hexyloxy)-5-
oxopentyloxy)-2-methylprop-2-en-1-one n ~ 1.0
1-(5-(6-(4-(4-(4-methylbenzoyloxy)phenyloxycarbonyl)phenoxy)hexyloxy)-5-
oxopentyloxy)-2-methylprop-2-en-1-one n ~ 8.1
1-(5-(5-(5-(5-(5-(5-(5-(5-(6-(4-(4-(4-methylbenzoyloxy)phenyloxycarbonyl)phenoxy)hexyloxy)-5-
oxopentyloxy)-5-oxopentyloxy)-5-oxopentyloxy)-5-oxopentyloxy)-5-oxopentyloxy)-5-
oxopentyloxy)-5-oxopentyloxy)-5-oxopentyloxy)-2-methylprop-2-en-1-one n ~ 7
1-(6-(6-(6-(6-(6-(6-(6-(8-(4-(4-(4-methylbenzoyloxy)phenyloxycarbonyl)phenoxy)octyloxy)-6-
oxohexyloxy)-6-oxohexyloxy)-6-oxohexyloxy)-6-oxohexyloxy)-6-oxohexyloxy)-6-
oxohexyloxy)-6-oxohexyloxy)-2-methylprop-2-en-1-one n ~ 8.7
1-(5-(5-(5-(5-(5-(5-(5-(5-(5-(6-(4-(4-(4-methylbenzoyloxy)phenyloxycarbonyl)phenoxy)hexyloxy)-5-
oxopentyloxy)-5-oxopentyloxy)-5-oxopentyloxy)-5-oxopentyloxy)-5-oxopentyloxy)-5-
oxopentyloxy)-5-oxopentyloxy)-5-oxopentyloxy)-2-methylprop-2-en-1-one -continued

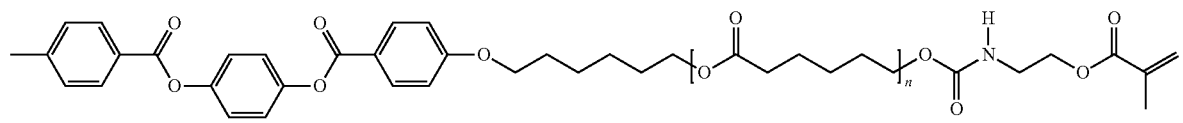

n ~ 8.3
1-(6-(6-(6-(6-(6-(6-(6-(6-(8-(4-(4-(4-methylbenzoyloxy)phenyloxycarbonyl)phenoxy)octyloxy)-6-
oxohexyloxy)-6-oxohexyloxy)-6-oxohexyloxy)-6-oxohexyloxy)-6-oxohexyloxy)-6-oxohexyloxy)-6-
oxohexyloxy)-6-oxohexyloxy)-1-carbonylaminoethyloxy-2-methylprop-2-en-1-one

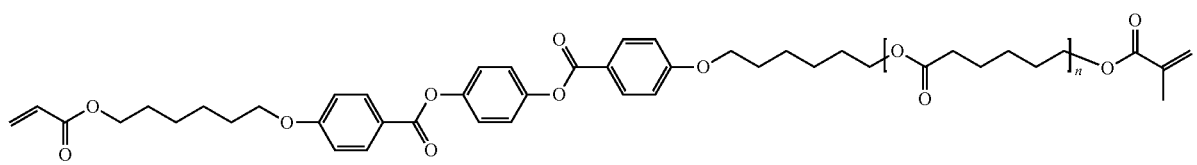

n ~ 8
1-(6-(6-(6-(6-(6-(6-(6-(6-(6-(4-(4-(4-(6-acryloyloxyhexyloxy)benzoyloxy)phenyloxycarbonyl)
phenyloxy)hexyloxy)-6-oxohexyloxy)-6-oxohexyloxy)-6-oxohexyloxy)-6-oxohexyloxy)-
6-oxohexyloxy)-6-oxohexyloxy)-6-oxohexyloxy)-6-oxohexyloxy)-2-methylprop-2-en-1-one

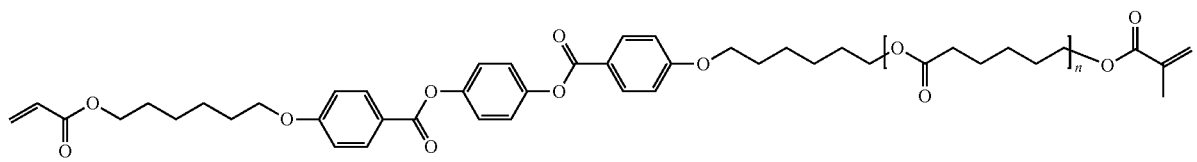

n ~ 3
1-(6-(6-(6-(6-(4-(4-(4-(6-acryloyloxyhexyloxy)benzoyloxy)phenyloxycarbonyl)
phenyloxy)hexyloxy)-6-oxohexyloxy)-6-oxohexyloxy)-6-oxohexyloxy)-2-methylprop-2-en-1-one

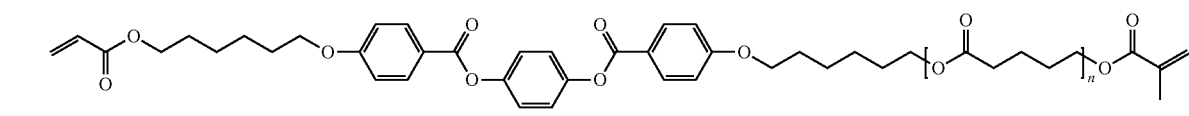

n ~ 1.3
1-(5-(5-(5-(5-(5-(6-(4-(4-(4-(6-acryloyloxyhexyloxy)benzoyloxy)phenyloxycarbonyl)
phenyloxy)hexyloxy)-5-oxopentyloxy)-5-oxopentyloxy)-5-oxopentyloxy)-5-oxopentyloxy)-5-oxopentyloxy)-
-2-methylprop-2-en-1-one

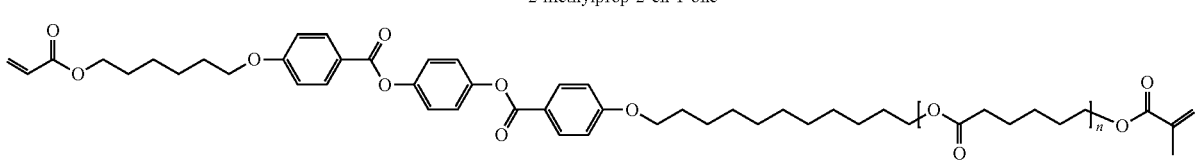

n ~ 2.8
1-(6-(6-(6-(11-(4-(4-(4-(4-(6-acryloyloxyhexyloxy)benzoyloxy)phenyl)phenyloxycarbonyl)phenyloxy)
undecanyloxy)-6-oxohexyloxy)-6-oxohexyloxy)-6-oxohexyloxy)-2-
methylprop-2-en-1-one

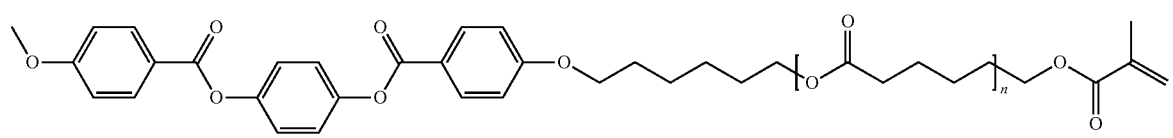

n ~ 2.9
1-(6-(6-(6-(6-(6-(6-(6-(8-(4-(4-(4-methylbenzoyloxy)phenyloxycarbonyl)phenoxy)octyloxy)-6-
oxohexyloxy)-6-oxohexyloxy)-6-oxohexyloxy)-6-oxohexyloxy)-6-oxohexyloxy)-6-oxohexyloxy)-6-
oxohexyloxy)-2-methylprop-2-en-1-one -continued

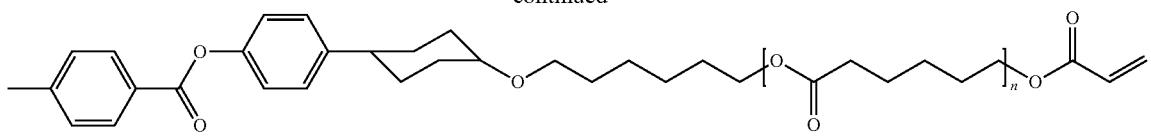

n ~ 10
1-(6-(6-(6-(6-(6-(6-(6-(6-(6-(6-(trans-4-(4-(4-methylbenzoyloxy)phenyl)cyclohexyloxy)hexyloxy)-6-
oxohexyloxy)-6-oxohexyloxy)-6-oxohexyloxy)-6-oxohexyloxy)-6-oxohexyloxy)-6-oxohexyloxy)-6-
oxohexyloxy)-6-oxohexyloxy)-6-oxohexyloxy)prop-2-en-1-one

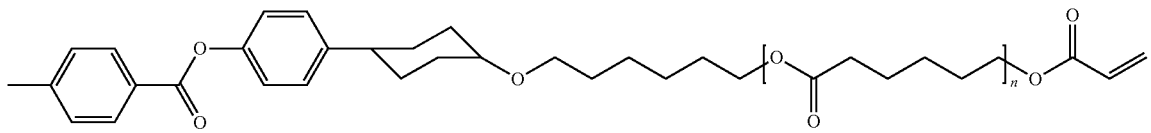

n ~ 2
1-(6-(6-(6-(trans-4-(4-(4-methylbenzoyloxy)phenyl)cyclohexyloxy)hexyloxy)-6-
oxohexyloxy)-6-oxohexyloxy)prop-2-en-1-one

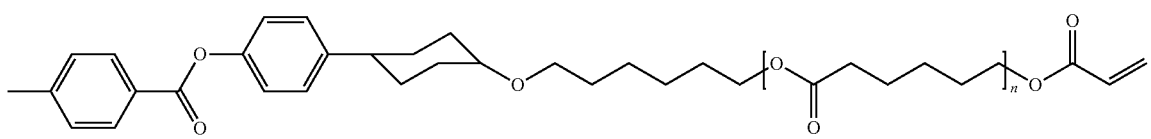

n ~ 20
1-(6-(6-(6-(6-(6-(6-(6-(6-(6-(6-(6-(6-(6-(6-(6-(6-(6-(6-(6-(6-(trans-4-(4-(4-methylbenzoyloxy)phenyl)cyclohexyloxy)hexyloxy)-6-
oxohexyloxy)-6-oxohexyloxy)-6-oxohexyloxy)-6-oxohexyloxy)-6-oxohexyloxy)-6-oxohexyloxy)-
6-oxohexyloxy)-6-oxohexyloxy)-6-oxohexyloxy)-6-oxohexyloxy)-6-oxohexyloxy)-6-oxohexyloxy)-
6-oxohexyloxy)-6-oxohexyloxy)-6-oxohexyloxy)-6-oxohexyloxy)-6-oxohexyloxy)-6-oxohexyloxy)-
6-oxohexyloxy)-6-oxohexyloxy)prop-2-en-1-one

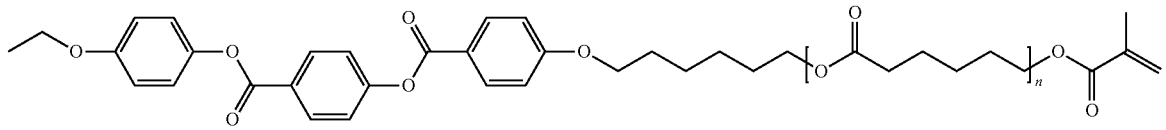

n ~ 9.0
1-(6-(6-(6-(6-(6-(6-(6-(6-(6-(6-(4-(4-(4-ethoxyphenoxycarbonyl)phenyloxycarbonyl)phenoxy)hexyloxy)-6-
oxohexyloxy)-6-oxohexyloxy)-6-oxohexyloxy)-6-oxohexyloxy)-6-oxohexyloxy)-6-oxohexyloxy)-6-
oxohexyloxy)-6-oxohexyloxy)-6-oxohexyloxy)-2-methylprop-2-en-1-one

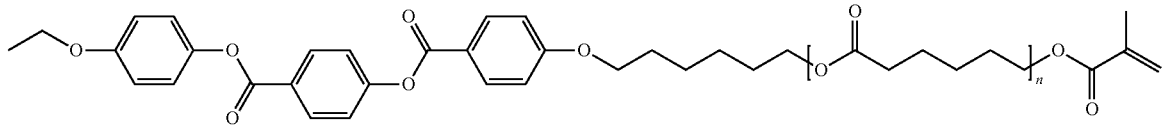

n ~ 3
1-(6-(6-(6-(4-(4-(4-ethoxyphenoxycarbonyl)phenyloxycarbonyl)phenoxy)hexyloxy)-6-
oxohexyloxy)-6-oxohexyloxy)-6-oxohexyloxy)-2-methylprop-2-en-1-one

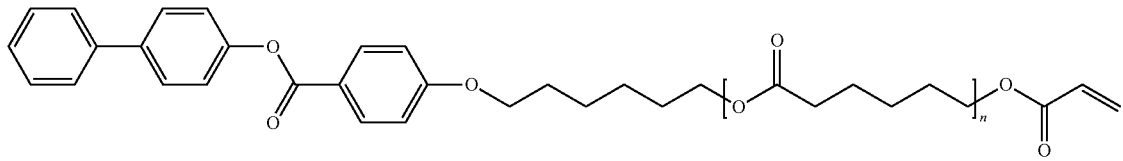

n ~ 10
1-(6-(6-(6-(6-(6-(6-(6-(6-(6-(6-(4-(4-phenylphenoxycarbonyl)phenoxy)hexyloxy)-6-
oxohexyloxy)-6-oxohexyloxy)-6-oxohexyloxy)-6-oxohexyloxy)-6-oxohexyloxy)-
6-oxohexyloxy)-6-oxohexyloxy)-6-oxohexyloxy)-
6-oxohexyloxy)prop-2-en-1-one -continued

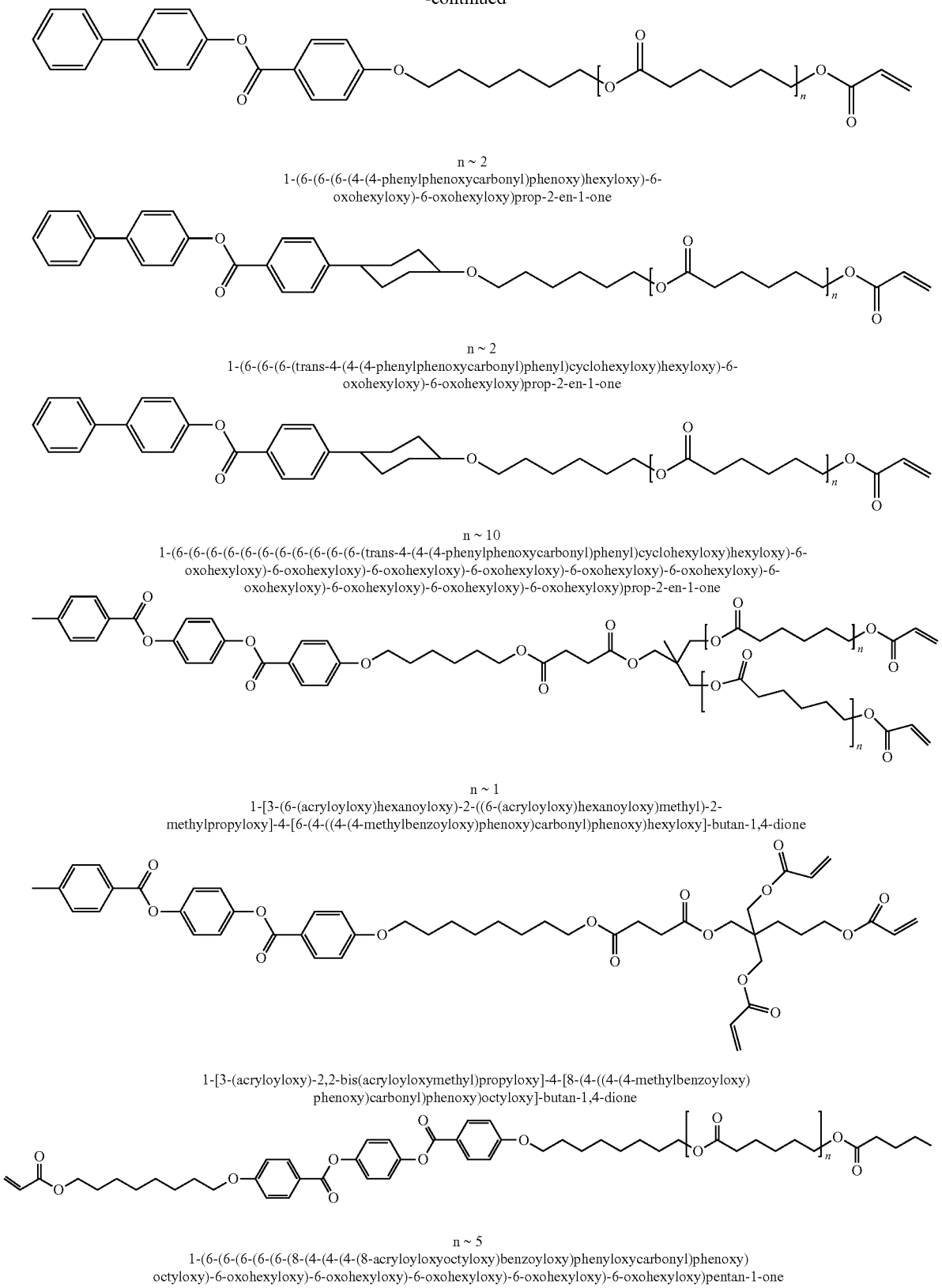

n ~ 2
1-(6-(6-(6-(4-(4-phenylphenoxycarbonyl)phenoxy)hexyloxy)-6-oxohexyloxy)-6-oxohexyloxy)prop-2-en-1-one n ~ 2
1-(6-(6-(6-(trans-4-(4-(4-phenylphenoxycarbonyl)phenyl)cyclohexyloxy)hexyloxy)-6-oxohexyloxy)-6-oxohexyloxy)prop-2-en-1-one n ~ 10
1-(6-(6-(6-(6-(6-(6-(6-(6-(6-(6-(trans-4-(4-(4-phenylphenoxycarbonyl)phenyl)cyclohexyloxy)hexyloxy)-6-oxohexyloxy)-6-oxohexyloxy)-6-oxohexyloxy)-6-oxohexyloxy)-6-oxohexyloxy)-6-oxohexyloxy)-6-oxohexyloxy)-6-oxohexyloxy)prop-2-en-1-one n ~ 1
1-[3-(6-(acryloyloxy)hexanoyloxy)-2-((6-(acryloyloxy)hexanoyloxy)methyl)-2-methylpropyloxy]-4-[6-(4-((4-(4-methylbenzoyloxy)phenoxy)carbonyl)phenoxy)hexyloxy]-butan-1,4-dione 1-[3-(acryloyloxy)-2,2-bis(acryloyloxymethyl)propyloxy]-4-[8-(4-((4-(4-methylbenzoyloxy)phenoxy)carbonyl)phenoxy)octyloxy]-butan-1,4-dione n ~ 5
1-(6-(6-(6-(6-(8-(4-(4-(4-(8-acryloyloxyoctyloxy)benzoyloxy)phenyloxycarbonyl)phenoxy)octyloxy)-6-oxohexyloxy)-6-oxohexyloxy)-6-oxohexyloxy)-6-oxohexyloxy)-6-oxohexyloxy)pentan-1-one or a combination of any of the foregoing.

Dielectric compositions can comprise a combination of mesogenic compounds having two reactive functional groups (difunctional mesogenic compound), and mesogenic compounds having one reactive functional group (monofunctional mesogenic compound). A reactive functional group can be a photoreactive functional group such as an acrylate or methacrylate group. A reactive functional group can be a photoreactive functional group such as an acrylate or methacrylate group. The molar ratio of difunctional mesogenic compounds to monofunctional mesogenic compounds can be, for example, from 2:1 to 1:1, from 1.8:1 to 1:1, from 1.6:1 to 1:1, from 1.4:1 to 1:1 or from 1.2:1 to 1:1. A ratio of bifunctional mesogenic compounds to monofunctional mesogenic compounds can be selected such that the polymerized mesogenic compounds on average form short chains of two or three mesogenic compounds.

A dielectric composition can comprise, for example, from 40 wt % to 80 wt % of a combination of polymerizable mesogenic monomers, from 45 wt % to 75 wt %, from 50 wt % to 70 wt %, or from 55 wt % to 65 wt % of a combination of polymerizable mesogenic monomers, such as photopolymerizable mesogenic monomers, or thermally-initiated mesogenic monomers, where wt % is based on the total weight of the composition.

Dielectric compositions may also comprise a surfactant or combination of surfactants.

Surfactants include materials such as wetting agents, anti-foaming agents, emulsifiers, dispersing agents, and leveling agents. Surfactants can be anionic, cationic, or nonionic.

A dielectric composition provided by the present disclosure can comprise, for example, from 0.001 wt % to 0.200 wt % of a surfactant or combination of surfactants, from 0.0005 wt % to 0.5000 wt %, from 0.01 wt % to 0.12 wt %, from 0.02 wt % to 0.10 wt % of a surfactant or combination of surfactants, where wt % is based on the total weight of the composition.

Examples of suitable nonionic surfactants include ethoxylated alkyl phenols, such as the IGEPAL® DM surfactants (Sigma Aldrich) or octyl-phenoxypolyethoxyethanol available as TRITON® X-100 (Sigma Aldrich), acetylenic diols such as 2,4,7,9-tetramethyl-5-decyne-4,7-diol available as SURFYNOL® 104 (Air Products), ethoxylated acetylenic diols such as SURFYNOL® 400 surfactants, and fluorosurfactants such as FLUORAD® fluorochemical surfactants (3M). Examples of suitable capped nonionic surfactants include benzyl capped octyl phenol ethoxylated available as TRITON® CF87, propylene oxide capped alkyl ethoxylates such as PLURAFAC® RA surfactants (BASF), octylphenoxyhexadecylethoxy benzyl ether, polyether modified dimethylpolysiloxane copolymer available as BYK®-306 (Byk-Chemie). A surfactant can include a combination of any of the foregoing surfactants.

Dielectric compositions provided by the present disclosure can comprise a polymerization inhibitor to stabilize the reactive monomers and prevent spontaneous polymerization. For example, dielectric compositions provided by the present disclosure can comprise monomethyl ether hydroquinone (MEHQ, 4-hydroxy phenol) as a polymerization inhibitor.

Dielectric compositions can comprise, for example, from 0.001 wt % to 0.200 wt % of a polymerization inhibitor or combination of polymerization inhibitors, from 0.0005 wt % to 0.5000 wt %, from 0.01 wt % to 0.12 wt %, from 0.02 wt % to 0.10 wt % of a polymerization inhibitor or combination of polymerization inhibitors, where wt % is based on the total weight of the composition.

Examples of suitable polymerization inhibitors include butylated hydroxytoluene and butylhydroxytoluene (BHT).

Photopolymerizable compositions can be cured, for example, upon exposure to ultraviolet (UV) radiation. A photopolymerizable composition can comprise a photoinitiator.

Dielectric compositions provided by the present disclosure can comprise, for example, from 0.01 wt % to 5 wt % of a photoinitiator or combination of photoinitiators, from 0.05 wt % to 4 wt %, from 0.2 wt % to 3 wt %, or from 0.5 wt % to 2 wt % of a photoinitiator or combination of photoinitiators, where wt % is based on the total weight of the composition.

Examples of suitable photoinitiators include cleavage-type photoinitiators and abstraction-type photoinitiators. Examples of suitable cleavage-type photoinitiators include acetophenones, α-aminoalkylphenones, benzoin ethers, benzoyl oximes, acylphosphine oxides and bisacylphosphine oxides and combinations of any of the foregoing. Examples of suitable abstraction-type photoinitiators include benzophenone, Michler's ketone, thioxanthone, anthraquinone, camphorquinone, fluorone, ketocoumarin and combinations of any of the foregoing.

Polymerizable compositions provided by the present disclosure can be thermally activated. A thermally-activated polymerizable composition can comprise a thermal initiator. Examples of suitable thermal initiators include azo compounds such as 4,4'-azobis(4-cyanovaleric acid), 1,1'-azobis(cyclohexanecarbonitirle), azobisisobutyronitrile, 2,2'-azobis(2-methylpropionamidine), and 2,2'-azobis(2-methylpropionitrile; inorganic peroxides such as ammonium persulfate, hydroxymethanesulfinic acid, potassium persulfate, and sodium persulfate; and organic peroxides such as tert-butyl hydroperoxide, cumene hydroperoxide, 2,5-di(tert-butylperoxy)-2,5-dimethyl-3-hexyne, 1,1-bis(tert-butylperoxy)cyclohexane, 2,5-di(tert-butylperoxy)-2,5-dimethyl-3-hexane, benzoyl peroxide, 2-butanone peroxide, and tert-butyl peroxide.

Polymerizable compositions provided by the present disclosure may not include a photoinitiator or a thermal initiator.

Dielectric compositions can comprise a drying agent to remove or sequester water. Examples of suitable drying agents include calcium chloride, calcium sulfate, magnesium sulfate, potassium carbonate, potassium hydroxide and sodium sulfate.

Dielectric compositions can be applied to a substrate surface or to a coating or film overlying a substrate surface. A substrate surface can first be cleaned, for example, by wiping with a volatile solvent such as acetone and dried with nitrogen gas. A substrate can also be cleaned with a plasma such as an oxygen plasma.

A cleaned substrate surface can be planarized by applying a thin layer of a polymer coating. Examples of materials used as planarization layers include polyvinyl alcohol. A planarization layer can be applied, for example, by spin coating or brushing.

An alignment layer can be applied to the substrate surface using, for example, spin coating a material such as polyvinyl alcohol onto the surface. An alignment layer can have a thickness, for example, less than 100 nm, less than 50 nm, less than 25 nm, or less than 10 nm.

The alignment layer can be oriented, for example, by uni-directionally rubbing the alignment layer.

After the alignment layer is oriented, a dielectric composition can be applied to the aligned layer, for example, by spin coating, brushing or other suitable method capable of providing a layer having a thickness, for example, less than 200 µm, less than 100 µm, less than 75 µm, less than 25 µm, less than 20 µm, less than 15 µm, less than 10 µm, or less than 5 µm.

After application to an aligned surface, the mesogenic compounds in the composition self-align. The mesogenic compounds can be allowed to self-align at room temperature or at elevated temperature. Heat and/or vibration may be applied to facilitate alignment of the mesogenic compounds. Heating the dielectric composition can also facilitate solvent removal from the thin layer. The mesogenic compounds can self-align such that the long axis of the mesogenic compounds assumes an orientation that is generally parallel to the general direction of orientation of the surface. The mesogenic compounds will exhibit a piezoelectric and/or flexoelectric effect when the dipole moments of the mesogenic compounds are aligned perpendicular to the surface.

The aligned dielectric composition can be heated to remove solvents, and then exposed to UV radiation to cure the polymerizable liquid crystal. Any suitable UV source may be used at an appropriate UV flux sufficient to photopolymerize the liquid crystal monomers. Alternatively, an aligned dielectric composition comprising a thermal initiator can be heated to polymerize the liquid crystal monomers. A cured layer provided by the present disclosure can be characterized by a thickness, for example, less than 100 µm, less than 75 µm, less than 50 µm, less than 25 µm, less than 10 µm, or less than 5 µm. A cured layer provided by the present disclosure can be characterized by a thickness from 1 µm to 100 µm, from 5 µm to 100 µm, from 1 µm to 75 µm, from 1 µm to 50 µm, or from 1 µm to 25 µm.

Cured dielectric layers provided by the present disclosure are thermoset materials.

Cured dielectric layers provided by the present disclosure can exhibit piezoelectric and/or flexoelectric properties.

In certain uses, the piezo- and/or flexo-electric effect can be enhanced by post-processing treatment such as by annealing, stretching, and/or biaxial-orientation.

Dielectric layers provided by the present disclosure may be used in piezoelectric and flexoelectric devices such as sensors, actuators, energy harvesters, and electromechanical energy conversion devices. Dielectric layers provided by the present disclosure can be used in electronic devices such as in transducers, sensors, actuators, ferroelectric memories, and in capacitors by electrical devices.

A dielectric layer provided by the present disclosure can comprise a coating on a substrate. The substrate may be of any suitable thickness and rigidity. The dielectric layer may be applied as a coating to the substrate or may be a layer of a multi-layer structure.

A dielectric layer provided by the present disclosure can be electrically connected with electrodes. The electrodes may be interconnected to a portion of the dielectric layer. The electrodes can be in the form of a thin film such that a dielectric layer provided by the present disclosure is sandwiched between the two thin films forming the electrodes. The electrodes may have any suitable shape, dimensions or configuration. For example, the electrodes may be in the form of an interdigitated comb pattern.

Dielectric layers provided by the present disclosure do not require poling and are polymerized. As a consequence the dielectric layers cannot be become depoled thermally, electrically, or mechanically.

EXAMPLES

Embodiments provided by the present disclosure are further illustrated by reference to the following examples, which describe the synthesis, properties, and uses of certain compositions comprising polymerizable mesogenic compounds, layers formed from the compositions, and devices fabricated from the compositions. It will be apparent to those skilled in the art that many modifications, both to materials, and methods, may be practiced without departing from the scope of the disclosure.

Examples 1-3 describe the preparation of the materials of the present invention. Example 4 describes the methods used to measure the melting points and the liquid crystal phase transition temperatures of Examples 1-3. These examples are also disclosed in U.S. Pat. No. 8,628,685, which is incorporated by reference in its entirety.

The following abbreviations were used for the chemicals listed in the Examples and Figures:

Al(OiPr)$_3$ aluminum triisopropylate
DHP 3,4-dihydro-2H-pyran
DCC dicyclohexylcarbodiimide
DIAD diisopropyl azodicarboxylate
DMAP 4-dimethylaminopyridine
PPh$_3$ triphenyl phosphine
PPTS pyridine p-toluenesulfonate
NMP N-methylpyrrolidone
NMR proton nuclear magnetic resonance;
TBD 1,5,7-triazabicyclo[4.4.0]dec-5-ene
THF tetrahydrofuran

Example 1

Synthesis of Mesogenic Compounds

Step 1: To a reaction flask was added 4-hydroxybenzoic acid (20 g), 3-chloro-1-propanol (34 g), N-methylpyrrolidone (NMP) (200 mL), and potassium carbonate (50 g) and the mixture was vigorously stirred at 110° C. for 4 hours. The resulting mixture was extracted using 1/1 volume ratio of ethyl acetate/hexanes (1 L) and water (500 mL). The separated organic layer was washed several times with water to remove NMP and then dried over magnesium sulfate. After concentration, the recovered oil (40 g) was used directly in the next step.

Step 2: To a reaction flask was added the product from Step 1 (40 g), succinic anhydride (40 g), DMAP (0.5 g) and THF (200 mL) and the resulting mixture was refluxed for 4 hours. Extraction was done using ethyl acetate (1 L) and water (1 L). The organic layer was separated, dried over magnesium sulfate and concentrated. The resulting product was purified by silica column separation using a mixture of ethyl acetate/hexane (8/2 volume/volume (v/v)). A clear oil (36.6 g) was obtained as the product. NMR showed that the product had a structure consistent with 4-(3-((4-(3-((3-carboxypropanoyl)oxy)propoxy)benzoyl)oxy)propoxy)-4-oxobutanoic acid.

Step 3: To a reaction flask was added 6-chloro-1-hexanol (51 g), methylene chloride (200 mL) and p-toluenesulfonic acid monohydrate (0.5 g). The mixture was stirred at room temperature. DHP (33.5 g) was added through a dropping funnel over a 20 minute interval. The resulting mixture was stirred at room temperature for an hour and then concentrated. The recovered clear oil (79 g) was used directly in the next step.

Step 4: To a reaction flask containing the product from Step 3 (78.2 g) was added ethyl 4-hydroxybenzoate (65 g), potassium carbonate (147 g) and NMP (700 mL). The mixture was stirred at 120° C. for six hours and then poured to 1.5 L of water. The mixture was extracted with hexane (1.5 L). The separated organic layer was washed with water, dried over magnesium sulfate and concentrated. The recovered clear oil (126.7 g) was used directly in the next step.

Step 5: To the reaction flask containing the product from Step 4 (126.7 g) was added sodium hydroxide water solution (64 g of a 50 weight percent solution based on the total weight of the solution), methanol (300 mL) and water (200 mL). The mixture was refluxed for 2 hours and most of the methanol was removed using a rotary evaporator. Water (1.5 L) was added to the resulting mixture and a clear solution was obtained. The pH of the solution was adjusted to ~7 by the slow addition of 3M HCl (~270 mL was used). A large amount of an undesired precipitate formed. The resulting mixture was extracted with ethyl acetate twice (500 mL each time). The separated organic layer was washed with water, dried over magnesium sulfate and concentrated until solids started to form. Hexanes (1 L) was added to further crystallization of the product. The resulting crystals were collected by filtration and dried in a vacuum oven. White crystals were obtained as the product (89.7 g). NMR showed that the product had a structure consistent with 4-(6-(tetrahydro-2H-pyran-2-yloxy)hexyloxy)benzoic acid.

Step 6: To a reaction flask was added 4-(trans-4-propylcyclohexyl)phenol (4.78 g), 4-(6-(tetrahydro-2H-pyran-2-yloxy)hexyloxy)benzoic acid (7.068 g) from Step 5, N,N'-dicyclohexylcarbodiimide (5 g), 4-dimethylaminopyridine (0.25 g) and methylene chloride (100 ml). The mixture was stirred at room temperature for 4 hours. The solid byproduct that formed was filtered off The resulting solution was concentrated and ethanol (100 mL), 1,2-dichloroethane (100 mL) and pyridinium p-toluenesulfonate (1 g) were added. The resulting mixture was refluxed for 2 days and then concentrated. The product was purified by silica column separation using methylene chloride/acetone (50/1 v/v) followed by recrystallization from methanol. White crystals (6.47 g) were obtained as the product. NMR showed that the product had a structure consistent with 4-(trans-4-propylcyclohexyl)phenyl 4-((6-hydroxyhexyl)oxy)benzoate.

Step 7: To a reaction flask was added 4-(trans-4-propylcyclohexyl)phenyl 4-((6-hydroxyhexyl)oxy)benzoate (1.47 g) from Step 6, 4-(3-((4-(3-((3-carboxypropanoyl)oxy)propoxy)benzoyl)oxy)propoxy)-4-oxo-butanoic acid (0.76 g) from Step 2, N,N'-dicyclohexylcarbodiimide (0.72 g), 4-dimethylaminopyridine (0.03 g) and methylene chloride (20 mL). The mixture was stirred at room temperature for 4 hours. The solid byproduct that formed was filtered off. The solution was concentrated and the product was purified by silica column separation using methylene chloride/acetone (50/1 v/v) followed by recrystallization from a mixture of methylene chloride/ethanol. A white solid (0.97 g) was obtained as the product. NMR showed that the product had a structure consistent with 1-{3-(4-(3-(4-(6-(4-(4-(4-propylcyclohexyl)phenoxycarbonyl)phenoxy)-hexyloxy)-4-oxobutanoyloxy)propyloxy)benzoyloxy)propyloxy}-4-{6-(4-(4-(trans-4-propylcyclohexyl)phenoxycarbonyl)phenoxy)hexyloxy}butane-1,4-dione.

Example 2

Synthesis of Mesogenic Compounds

Step 1: To a reaction flask was added 4-hydroxybenzoic acid (90 grams (g), 0.65 mole), ethyl ether (1000 mL) and p-toluenesulfonic acid (2 g). The resulting suspension was stirred at room temperature. 3,4-Dihydro-2H-pyran (DHP) (66 g, 0.8 mole) was added to the mixture. The suspension turned clear soon after the addition of DHP and a white crystalline precipitate formed. The mixture was then stirred at room temperature overnight. The resulting precipitate was collected by vacuum filtration and washed with ethyl ether. White crystals were recovered as the product (90 g). NMR showed that the product had a structure consistent with 4-(tetrahydro-2H-pyran-2-yloxy)benzoic acid.

Step 2: To a reaction flask was added 4-(tetrahydro-2H-pyran-2-yloxy)benzoic acid (17 g) from Step 1, 4-(trans-4-propylcyclohexyl)phenol (15.1 g), dicyclohexylcarbodiimide (DCC) (15.7 g), 4-dimethylaminopyridine (DMAP) (0.8 g) and methylene chloride (100 ml). The resulting mixture was stirred at room temperature for 2 hours. The resulting solid byproduct was filtered off. The solution was concentrated and methanol (100 mL), 1,2-dichloroethane (100 mL) and pyridine p-toluenesulfonate (PPTS) (2 g) were added. The resulting mixture was heated to reflux and maintained at reflux for 6 hours. Solvent was removed and the resulting product was purified by silica column separation using a mixture of ethyl acetate/hexane (2/8 v/v). A white solid was obtained as the product (16 g). NMR showed that the product had a structure consistent with 4-(trans-4-propylcyclohexyl)phenyl-4-hydroxybenzoate.

Step 3: To a reaction flask was added the product of Step 2 (4.98 g), polycaprolactone diol (2.6 g, Aldrich catalogue number 189405), triphenyl phosphine (3.86 g), THF (40 mL) and diisopropyl azodicarboxylate (2.98 g). The resulting mixture was stirred at room temperature for 20 hours. After concentration, a silica gel flash column separation using ethyl acetate hexanes mixture was used to collect the major components of the products. A white solid was recovered as the product (3.2 g). NMR showed that the product had a structure consistent with 2,2'-bis(6-(6-(4-(4-(trans-4-propylcyclohexyl)phenoxycarbonyl)phenoxy)hexanoyloxy)-6-hexanoyloxy)diethylether with each n having an average distribution of 2.2.

Example 3

Synthesis of Mesogenic Compounds

Step 1: 4-Nonylbenzoyl chloride (15 g) was slowly added to a reaction flask containing a mixture of pyridine (110 mL) and hydroquinone (33.2 g) and the resulting mixture was stirred for four hours, poured into water (3 L) and the pH was adjusted to ~3 with the slow addition of 12 N HCl. The resulting solution was extracted with hexane (200 mL). The resulting hexane solution was washed with water, dried and concentrated. Methanol (100 mL) was added and the undesirable solid byproduct that formed was filtered off. The methanol solution was collected, concentrated and dried. White solid (17 g) was obtained as the product. NMR showed that the product had a structure consistent with 4-hydroxyphenyl 4-nonylbenzoate.

Step 2: To a reaction flask was added 4-hydroxyphenyl 4-nonylbenzoate from Step 1 (9.22 g), 4-(6-(tetrahydro-2H-pyran-2-yloxy)hexyloxy)benzoic acid (7.94 g) from Step 5 of Example 1, N,N'-dicyclohexylcarbodiimide (6.1 g), 4-dimethylaminopyridine (0.3 g) and methylene chloride (100 mL). The mixture was stirred at room temperature for 24 hours. The solid byproduct that formed was filtered off. The resulting solution was concentrated until solids started to form. Methanol (100 mL) was added to further crystallization of the product. White crystals were collected by vacuum filtration and dried (13.41 g). NMR showed that the product had a structure consistent with 4-((4-nonylbenzoyl)oxy)phenyl 4-((6-(((tetrahydro-2H-pyran-2-yl)oxy)hexyl)oxy)benzoate.

Step 3: To a reaction flask was added product from Step 2 (13.41 g), methanol (80 mL), chloroform (200 mL) and pyridinium p-toluenesulfonate (0.52 g). The mixture was refluxed for six hours and then concentrated. Methanol (200 mL) was added. The resulting white solid (11 g) was collected as the product. NMR showed that the product had a structure consistent with 4-((4-((6-hydroxyhexyl)oxy)benzoyl)oxy)phenyl-4-nonylbenzoate.

Step 4: To a reaction flask was added the product from Step 3 (5.56 g), succinic anhydride (1.98 g), DMAP (0.04 g) and THF (100 mL). The resulting mixture was refluxed for 4 hours and poured into water (1 L). The precipitate that formed was collected and purified by silica column separation using a mixture of ethyl acetate/hexane (515 v/v). A white solid (5.77 g) was obtained as the product. NMR showed that the product had a structure consistent with 4-((6-(4-((4-((4-nonylbenzoyl)oxy)phenoxy)carbonyl)phenoxy)hexyl)oxy)-4-oxobutanoic acid.

Step 5: To a reaction flask was added the product from Step 4 (4 g), poly(hexamethylene carbonate) diol (1.7 g, $M_n$ 860, Aldrich catalogue number 461172), N,N'-dicyclohexylcarbo-diimide (1.26 g), 4-dimethylaminopyridine (0.06 g) and methylene chloride (20 mL). The mixture was stirred at room temperature for 24 hours. The solid byproduct that formed was filtered off. The resulting mixture was poured into a mixture of water (3 L) and sodium bicarbonate (10 g) and stirred for another 24 hours. Methylene chloride (200 mL) was added. The separated organic layer was collected, dried over magnesium sulfate and concentrated. The recovered solid was stirred in methanol for 2 hours. A white solid was collected and dried as the product (3 g). NMR showed that the product had a structure consistent with 1-{(6-(6-(6-(6-(6-(6-(4-(6-(4-(4-(4-nonylbenzoyloxy)phenoxycarbonyl)phenoxy)hexyloxy)-4-oxobutanoyloxy)hexyloxy)-6-carbonyloxyhexyloxy)-6-carbonyloxyhexyloxy)-6-carbonyloxyhexyloxy)-6-carbonyloxyhexyloxy)-6-carbonyloxyhexyloxy}-4-{6-(4-(6-(4-(4-(4-nonylbenzoyloxy)phenoxycarbonyl)phenoxy)hexyloxyl}butane-1,4-dione.

Example 4

A photopolymerizable composition was prepared by combining a solvent mixture with a composition comprising mesogenic compounds. The content of the two compositions are described in Table 1 and in Table 2, respectively.

TABLE 1

| Solvent mixture. | | |
|---|---|---|
| Component | Weight % | Weight (g) |
| BYK ®-322[1] | 0.10 | 0.2 |
| Methylethyl hydroquinone | 0.15 | 0.3 |
| Anisole | 99.75 | 199.5 |
| Total | 100.00 | 200.0 |

[1]Available from BYK-Chemie GmbH.

TABLE 2

| Photopolymerizable liquid crystal composition. | | |
|---|---|---|
| Component | Weight % | Weight (g) |
| Solvent mixture | 40 | 200 |
| Mesogenic Compound (1) | 24 | 120 |

TABLE 2-continued

| Photopolymerizable liquid crystal composition. | | |
|---|---|---|
| Component | Weight % | Weight (g) |
| Mesogenic Compound (4) | 24 | 120 |
| Mesogenic Compound (5) | 6 | 30 |
| Mesogenic Compound (6) | 6 | 30 |
| Total | 100 | 500 |
| Photoinitiator (Irgacure ® 819)[5] | 0.9 | 4.5 |
| Magnesium sulfate[1] | 10 | 50 |

[1]Available from EMD Chemicals Inc.

A solvent blend of anisole (199.5 g), monomethyl ether hydroquinone (MEHQ) (0.3 g), and BYK®-322 (aralkyl-modified polymethylalkylsiloxane, 0.2 g) were combined and heated to 90° C. Polymerizable mesogenic monomers, Compound (1) (120 g), Compound (4) (120 g), Compound (5) (30 g), and Compound (6) (30 g) were then added to the solvent blend. The mixture was stirred for at least 30 min until complete dissolution. A photoinitiator Irgacure® 819 (4.5 g) (BASF) was then added to the mixture and allowed to dissolve for 30 min at 50° C., after which time magnesium sulfate (50 g) was added, and the mixture stirred for an additional 30 min. The mixture was then filtered using a 5 micron syringe filter to obtain a clear filtrate.

Substrates were prepared by depositing a thin layer of indium tin oxide (ITO) on the surface of polyethylene terephthalate (PET). Substrates (ITO-coated PET; Sigma Aldrich) were pretreated with polyvinyl alcohol and aligned using specialized felt (Brewer Science, Inc.). The filtered solution was then spin-coated onto the aligned pre-treated substrates to a thickness of 20 μm using a spin coater (Brewer Science, Inc.; Cee® 300X). The spin-coated layer was baked at 50° C. for 30 min to remove solvent and then cured using a Fusion AETEK UV unit (Fusion Aetek UV Systems, Inc.). The UV unit included a single fusion lamp that provided an output of UVA at 0.359 W/cm$^2$, UVB at 0.361 W/cm$^2$, and UVC at 0.055 W/cm$^2$ at an 8-inch lamp height.

A setup was fabricated to measure flexoelectric response. A test sample was held horizontally by the two chucks and placed over two blades spaced about 1 inch apart. To measure flexure a blade attached to an Instron machine was pushed onto the test sample between the lower blades.

Test samples were prepared by sputtering an ITO electrode over the cured layer of dielectric material. An electrode was interconnected to the upper and lower surfaces of the test sample and the electrical properties measured while stress was applied.

The dielectric layers were tested at low forces at frequencies from 0.1 Hz to 10 Hz.

The results are presented in Table 2 and in Table 3.

TABLE 3

| Flexoelectric test results. Flexoelectric Test LCE S2 0.001% strain | | | |
|---|---|---|---|
| Frequency | $V_{PP}$[1] (V) | $F_{PP}$[2] (N) | V/F[3] |
| 0.1 Hz | 0.0865 | 0.0523 | 1.654 |
| 0.5 Hz | 0.1006 | 0.0667 | 1.677 |
| 1 Hz | 0.1105 | 0.0648 | 1.705 |
| 2 Hz | 0.1132 | 0.0667 | 1.697 |

TABLE 3-continued

Flexoelectric test results.
Flexoelectric Test LCE S2 0.001% strain

| Frequency | $V_{PP}^{1}$ (V) | $F_{PP}^{2}$ (N) | V/F[3] |
|---|---|---|---|
| 5 Hz | 0.1101 | 0.0383 | 2.875 |
| 10 Hz | 0.086 | 0.0515 | 1.668 |

[1]$V_{PP}$—peak to peak voltage (volt).
[2]$F_{PP}$—peak to peak force (Newton).
[3]V/F—ratio $V_{PP}/F_{PP}$.

TABLE 4

Flexoelectric test results.
LCR Meter Permittivity (0.005% Strain)

| Frequency (Hz) | Permittivity (F/m) | $E_{PP}^{1}$ (V/m) | $P^2$ (C/m²) | strain gradient[3] | $\mu_{12}$ (C/m) | $\mu_{12}^{4}$ (nC/m) |
|---|---|---|---|---|---|---|
| 0.1 | 3.50E−11 | 11318 | 2.96E−07 | 0.96 | 3.08E−07 | 308 |
| 0.5 | 3.50E−11 | 12209 | 3.19E−07 | 0.96 | 3.33E−07 | 333 |
| 1 | 3.50E−11 | 12939 | 3.38E−07 | 0.96 | 3.52E−07 | 352 |
| 2 | 3.50E−11 | 13219 | 3.46E−07 | 0.96 | 3.60E−07 | 360 |
| 5 | 3.50E−11 | 12635 | 3.30E−07 | 0.96 | 3.44E−07 | 344 |
| 10 | 3.50E−11 | 11409 | 2.98E−07 | 0.96 | 3.11E−07 | 311 |

[1]$E_{pp}$ - electric field.
[2]P - flexoelectric polarization.
[3]strain gradient.
[4]$\mu_{12}$ - flexoelectric coefficient.

The flexoelectric coefficient $\mu_{12}$ for flexoelectric materials typically range from nC/m to µC/m, and the flexoelectric coefficient $\mu_{12}$ calculated for the liquid crystal layers was on the order of 0.3 µC/m.

Example 5

Prototype Assembly A

X-Bond® 4000 (corrosion inhibitor available from PPG Industries) pretreated aluminum was used as the substrate. To prepare the substrate, the substrate surface rub aligned with felt, and the dielectric composition of Example 4 was spin coated onto the aligned surface to a thickness of 20 µm and UV cured. Polycarbonate bus ink P100889 was applied to the surface of the cured dielectric layer to provide an upper electrode. Silver ink, XPVS-76980 (PPG Industries, Inc.) was applied to the upper surface of the substrate to provide the lower electrode. A copper tape lead was adhered to the silver ink, and another copper tape was adhered to the upper surface of the aluminum substrate. The device was connected to an oscilloscope (Tektronix TDS 2002) for measurement of the voltage response.

Flexoelectric and potentially piezoelectric effects were determined for multiple devices. The flexoelectric response is shown in FIG. 1 for three-point bending on an aluminum substrate with 0.01% strain at 2 Hz. The dielectric layer was characterized by a $V_{pp}$ of 430 mV, at a force of 4.6 N. In comparison, a PVDF-TrFe (polyvinyledenedifluoride-trifluoroethylene copolymer) film exhibited a $V_{pp}$ of 580 mV at a force of 4.6 N.

The flexoelectric and piezoelectric properties of the dielectric layers were comparable to that of a PVDF-TrFE thermoplastic film.

Example 6

Prototype Assembly B

A polyethylene terephthalate (PET) sheet with a coating of indium tin oxide (ITO) was used as a substrate. The ITO film was pretreated with plasma for 5 min before being rubbed and coated with the dielectric composition of Example 4 and then UV cured. Good alignment was achieved when visually examined using a polarized light source.

Figure 2A:
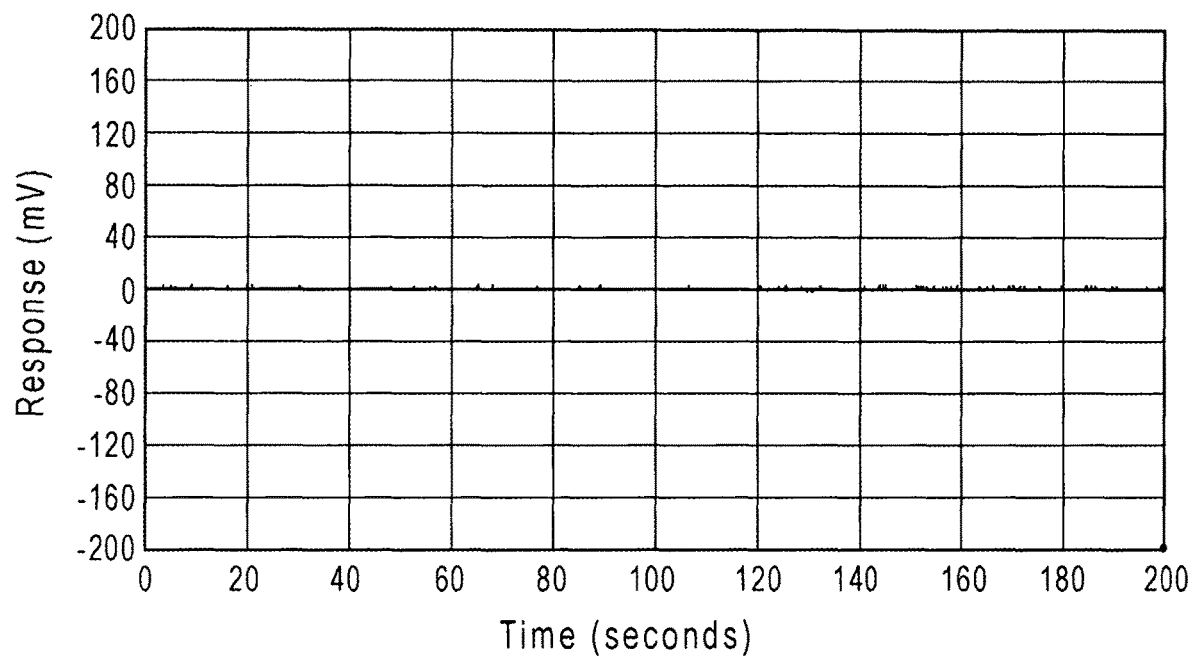
FIG. 2A shows the flexoelectric response of a device according to the present invention before an applied impact.
Figure 2B:
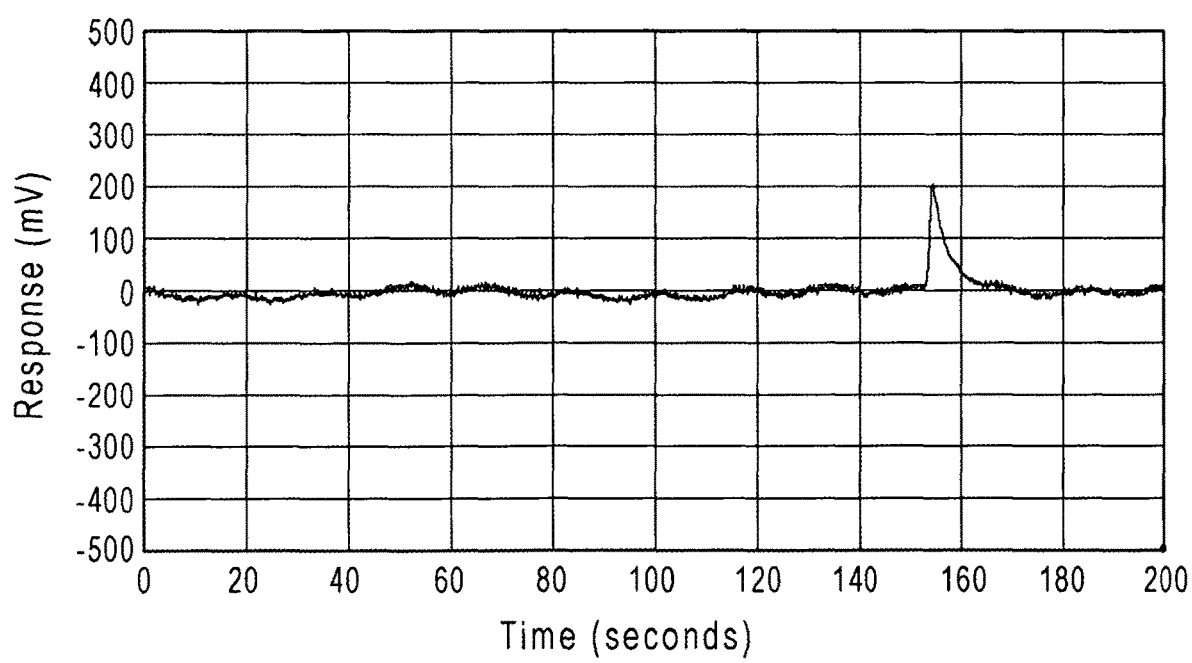
FIG. 2B shows the flexoelectric response of a device according to the present invention in response to an impact.

To fabricate the test structure, a second plasma cleaned ITO-PET electrode was placed over the first dielectric layer and pressed firmly together. Copper tape leads were adhered to both ITO films, and the dielectric device was tested using an oscilloscope (Tektronix TDS 2002). As shown by comparing FIG. 2A and FIG. 2B a voltage response was observed when the device was tapped and/or distorted and the flexoelectric effect measured. FIG. 2A shows the signal before tapping the device, and FIG. 2B shows the signal when the device was tapped.

Aspects of the Invention

Aspect 1. A polymerizable composition, comprising: a solvent; and a combination of polymerizable mesogenic monomers.

Aspect 2. The polymerizable composition of aspect 1, further comprising a photoinitiator, a thermal initiator, or a combination thereof.

Aspect 3. The polymerizable composition of any one of aspects 1 to 2, wherein the combination of polymerizable mesogenic monomers comprises a combination of photopolymerizable mesogenic monomers or a combination of thermally-activated polymerizable mesogenic monomers.

Aspect 4. The polymerizable composition of any one of aspects 1 to 3, wherein the combination of polymerizable mesogenic monomers comprises a compound of Formula (1):

$$P\text{-}(L)_w\text{-}(M^1\text{-}X)_z \qquad (1)$$

wherein,
a) each X is independently:
  i) a group —R;
  ii) a group represented by -(L)$_y$-R;
  iii) a group represented by -(L)-R;
  iv) a group represented by -(L)$_w$-Q;
  v) a group represented by a moiety of Formula (2):

$$\text{-}(L)^y\text{-}M^2\text{-}(L)_w\text{-}P \qquad (2)$$

vi) a group represented by -(L)$_y$-P; or
  vii) a group represented by -(L)$_w$-[(L)$_w$-P]$_y$;
b) P comprises a reactive group;
c) Q is selected from hydroxyl, amine, alkenyl, alkynyl, azido, silyl, silylhydride, oxy(tetrahydro-2H-pyran-2-yl), thiol, isocyanato, thioisocyanato, acryloxy, methacryloxy, 2-(acryloxy)ethylcarbamyl, 2-(methacryloxy)ethylcarbamyl, aziridinyl, allylcarbonate, epoxy, carboxylic acid, carboxylic ester, amide, carboxylic anhydride, and acyl halide;
d) each L is independently selected from a single bond, a polysubstituted, monosubstituted, unsubstituted or branched spacer independently comprising aryl, ($C_{1-30}$)alkyl, ($C_{1-30}$)alkylcarbonyloxy, ($C_{1-30}$)alkylamino, ($C_{1-30}$)alkoxy, ($C_{1-30}$)perfluoroalkyl, ($C_{1-30}$)perfluoroalkoxy, ($C_{1-30}$)alkylsilyl, ($C_{1-30}$)dialkylsiloxyl, ($C_{1-30}$)alkylcarbonyl, ($C_{1-30}$)alkoxycarbonyl,

49

(C$_{1-30}$)alkylcarbonylamino, (C$_{1-30}$)alkylaminocarbonyl, (C$_{1-30}$)alkylcarbonate, (C$_{1-30}$)alkylaminocarbonyloxy, (C$_{1-30}$)alkylaminocarbonylamino, (C$_{1-30}$)alkylurea, (C$_{1-30}$)alkylthiocarbonylamino, (C$_{1-30}$) alkylaminocarbonylthio, (C$_{2-30}$)alkene, (C$_{1-30}$) thioalkyl, (C$_{1-30}$)alkylsulfone, or (C$_{1-30}$)alkylsulfoxide, wherein each substituent is independently chosen from (C$_{1-5}$)alkyl, (C$_{1-5}$)alkoxy, fluoro, chloro, bromo, cyano, (C$_{1-5}$)alkanoate ester, isocyanato, thioisocyanato, and phenyl;

e) R is selected from hydrogen, C$_{1-18}$ alkyl, C$_{1-18}$ alkoxy, C$_{1-18}$ alkoxycarbonyl, C$_{3-10}$ cycloalkyl, C$_{3-10}$ cycloalkoxy, poly(C$_{1-18}$ alkoxy), and a straight-chain or branched C$_{1-18}$ alkyl group that is unsubstituted or substituted with cyano, fluoro, chloro, bromo, or C$_{1-18}$ alkoxy, or poly-substituted with fluoro, chloro, or bromo; and f) each of M$^1$ and M$^2$ independently comprises a rigid straight rod-like liquid crystal group, a rigid bent rod-like liquid crystal group, or a rigid disc-like liquid crystal group;

wherein,
w is an integer from 1 to 26;
y is an integer from 2 to 25; and
z is 1 or 2;
provided that when,
X is R, then w is an integer from 2 to 25, and z is 1;
X is -(L)$_y$-R, then w is 1, y is an integer from 2 to 25, and z is 1;
X is -(L)-R, then w is an integer from 3 to 26, and z is 2;
X is -(L)$_w$-Q; then if P is represented by the group Q, then w is 1, and z is 1; and if P is other than the group Q, then each w is independently an integer from 1 to 26 and z is 1;
X is a moiety of Formula (2), -(L)$_y$-M$^2$-(L)$_w$-P, then w is 1, y is an integer from 2 to 25, and z is 1;
X is -(L)$_y$-P, then w is 1, y is an integer from 2 to 25, and z is 1 and -(L)$_y$- comprises a linear sequence of at least 25 bonds between the mesogen and P; and
X is -(L)$_w$-[(L)$_w$-P]$_y$, then each w is independently an integer from 1 to 25, y is an integer from 2 to 6, and z is 1.

Aspect 5. The polymerizable composition of aspect 4, wherein the photo-activated group or thermally-activated group comprises an acrylate or a methacrylate.

Aspect 6. The polymerizable composition of any one of aspects 1 to 5, wherein the combination of polymerizable mesogenic monomers comprises: at least one polymerizable mesogenic monomer comprising two polymerizable reactive groups; and at least one polymerizable mesogenic monomer comprising one polymerizable reactive group.

Aspect 7. The polymerizable composition of aspect 6, wherein a molar ratio of the at least one polymerizable mesogenic monomer comprising two polymerizable reactive groups to the at least one polymerizable mesogenic monomer comprising one polymerizable reactive group is within a range from 1.5:1 to 1:1.

Aspect 8. The polymerizable composition of any one of aspects 1 to 7, wherein the combination of polymerizable mesogenic monomers comprise 2-methyl-1,4-phenylene bis(4-(3-(acryloyloxy)propoxy)benzoate) (Compound (1)); 4-methoxyphenyl 4-((6-(acryloyloxy)hexyl)oxy)benzoate (Compound (2)); 2-methyl-1,4-phenylene bis(4-((4-(acryloyloxy)butoxy)carbonyl)oxy)benzoate) (Compound (3)); 4-((4-((8-((6-methacryloyloxy)hexanoyl)oxy)octyl)oxy)benzoyl)oxy)phenyl 4-methylbenzoate n=8 (Compound

50

(4)); 4-((4-((8-((6-methacryloyloxy)hexanoyl)oxy)octyl)oxy)benzoyl)oxy)phenyl 4-methylbenzoate n=3 (Compound (5)); 4-((4-pentylcyclohexane-1-carbonyl)oxy)phenyl 4-((6-(acryloyloxy)hexyl)oxy)benzoate (Compound (6)); 3-(3,6-difluoro-4-(4'-propyl-[1,1'-bi(cyclohexan))]-4-yl)phenoxy) propyl acrylate (Compound (7)); or a combination of any of the foregoing.

Aspect 9. A dielectric device comprising a dielectric layer, wherein the dielectric layer is prepared from the polymerizable composition of any one of aspects 1 to 8.

Aspect 10. The dielectric device of aspect 9, wherein the dielectric device comprises a flexoelectric device, a piezoelectric device, or a combination thereof.

Aspect 11. The dielectric device of any one of aspects 9 to 10, wherein the dielectric device comprises: the dielectric layer; a first electrode interconnected to the dielectric layer; and a second electrode interconnected to the dielectric layer.

Aspect 12. The dielectric device of any one of aspects 9 to 11, wherein the first electrode comprises a first electrically conductive layer; the dielectric layer overlies the first electrically conductive layer; the second electrode comprise a second electrically conductive layer; and the second electrically conductive layer overlies the dielectric layer.

Aspect 13. The dielectric device of any one of aspects 9 to 12, wherein the dielectric layer is characterized by a thickness from 1 µm to 100 µm.

Aspect 14. A part comprising the dielectric device of any one of aspects 9 to 13.

Aspect 15. A method of preparing a dielectric layer, comprising: aligning a surface; applying the polymerizable composition of claim 1 to the aligned surface, wherein the polymerizable composition comprises a combination of polymerizable mesogenic monomers; allowing the applied combination of polymerizable mesogenic monomers to align; and polymerizing the aligned combination of polymerizable mesogenic monomers to form a dielectric layer.

Aspect 16. The method of aspect 15, wherein aligning comprises rubbing the surface.

Aspect 17. The method of any one of aspects 15 to 16, wherein allowing the applied combination of polymerizable mesogenic monomers to align comprises allowing the applied combination of polymerizable mesogenic monomers to self-align.

Aspect 18. The method of any one of aspects 15 to 17, wherein the combination of polymerizable mesogenic monomers comprises a combination of photopolymerizable mesogenic monomers, or a combination of thermally-initiated polymerizable mesogenic monomers.

Aspect 19. The method of any one of aspects 15 to 18, wherein the combination of polymerizable mesogenic monomers comprises a compound of Formula (1):

P-(L)$_w$-(M$^1$-X)$_z$ (1)

wherein,
a) each X is independently:
i) a group —R;
ii) a group represented by -(L)$_y$-R;
iii) a group represented by -(L)-R;
iv) a group represented by -(L)$_w$-Q;
v) a group represented by a moiety of Formula (2):

-(L)$^y$-M$^2$-(L)$_w$-P (2)

vi) a group represented by -(L)$_y$-P; or
vii) a group represented by -(L)$_w$-[(L)$_w$-P]$_y$;
b) P comprises a reactive group;
c) Q is selected from hydroxyl, amine, alkenyl, alkynyl, azido, silyl, silylhydride, oxy(tetrahydro-2H-pyran-2- yl), thiol, isocyanato, thioisocyanato, acryloxy, methacryloxy, 2-(acryloxy)ethylcarbamyl, 2-(methacryloxy)ethylcarbamyl, aziridinyl, allylcarbonate, epoxy, carboxylic acid, carboxylic ester, amide, carboxylic anhydride, or acyl halide;

d) each L is independently selected from a single bond, a polysubstituted, monosubstituted, unsubstituted or branched spacer independently comprising aryl, $(C_{1-30})$alkyl, $(C_{1-30})$alkylcarbonyloxy, $(C_{1-30})$alkylamino, $(C_{1-30})$alkoxy, $(C_{1-30})$perfluoroalkyl, $(C_{1-30})$perfluoroalkoxy, $(C_{1-30})$alkylsilyl, $(C_{1-30})$dialkylsiloxyl, $(C_{1-30})$alkylcarbonyl, $(C_{1-30})$alkoxycarbonyl, $(C_{1-30})$alkylcarbonylamino, $(C_{1-30})$alkylaminocarbonyl, $(C_{1-30})$alkylcarbonate, $(C_{1-30})$alkylaminocarbonyloxy, $(C_{1-30})$alkylaminocarbonylamino, $(C_{1-30})$alkylurea, $(C_{1-30})$alkylthiocarbonylamino, $(C_{1-30})$alkylaminocarbonylthio, $(C_{2-30})$alkene, $(C_{1-30})$thioalkyl, $(C_{1-30})$alkylsulfone, or $(C_{1-30})$alkylsulfoxide, wherein each substituent is independently chosen from $(C_{1-5})$alkyl, $(C_{1-5})$alkoxy, fluoro, chloro, bromo, cyano, $(C_{1-5})$alkanoate ester, isocyanato, thioisocyanato, or phenyl;

e) R is selected from hydrogen, $C_{1-18}$ alkyl, $C_{1-18}$ alkoxy, $C_{1-18}$ alkoxycarbonyl, $C_{3-10}$ cycloalkyl, $C_{3-10}$ cycloalkoxy, poly($C_{1-18}$ alkoxy), or a straight-chain or branched $C_{1-18}$ alkyl group that is unsubstituted or substituted with cyano, fluoro, chloro, bromo, or $C_{1-18}$ alkoxy, or poly-substituted with fluoro, chloro, or bromo; and f) each of $M^1$ and $M^2$ independently comprise a rigid straight rod-like liquid crystal group, a rigid bent rod-like liquid crystal group, or a rigid disc-like liquid crystal group;

wherein,
w is an integer from 1 to 26;
y is an integer from 2 to 25; and
z is 1 or 2;
provided that when,
X is R, then w is an integer from 2 to 25, and z is 1;
X is -(L)$_y$-R, then w is 1, y is an integer from 2 to 25, and z is 1;
X is -(L)-R, then w is an integer from 3 to 26, and z is 2;
X is -(L)$_w$-Q; then if P is represented by the group Q, then w is 1, and z is 1; and if P is other than the group Q, then each w is independently an integer from 1 to 26 and z is 1;
X is a moiety of Formula (2), -(L)$_y$-M$^2$-(L)$_w$-P, then w is 1, y is an integer from 2 to 25, and z is 1;
X is -(L)$_y$-P, then w is 1, y is an integer from 2 to 25, and z is 1 and (L)$_y$- comprises a linear sequence of at least 25 bonds between the mesogen and P; and
X is -(L)$_w$-[(L)$_w$-P]$_y$, then each w is independently an integer from 1 to 25, y is an integer from 2 to 6, and z is 1.

Aspect 20. The method of aspect 19, wherein the reactive group comprises an acrylate or a methacrylate.

Aspect 21. The method of any one of aspects 15 to 20, wherein the combination of polymerizable mesogenic monomers comprises: at least one polymerizable mesogenic monomer comprising two polymerizable reactive groups; and at least one polymerizable mesogenic monomer comprising one polymerizable reactive group.

Aspect 22. The method of aspect 21, wherein a molar ratio of the at least one polymerizable mesogenic monomer comprising two polymerizable reactive groups to the at least one polymerizable mesogenic monomer comprising one polymerizable reactive group is within a range from 1.5:1 to 1:1.

Aspect 23. The method of any one of aspects 15 to 22, wherein the combination of polymerizable mesogenic monomers comprises 2-methyl-1,4-phenylene bis(4-(3-(acryloyloxy)propoxy)benzoate) (Compound (1)); 4-methoxyphenyl 4-((6-(acryloyloxy)hexyl)oxy)benzoate (Compound (2)); 2-methyl-1,4-phenylene bis(4-((4-(acryloyloxy)butoxy)carbonyl)oxy)benzoate) (Compound (3)); 4-((4-((8-((6-methacryloyloxy)hexanoyl)oxy)octyl)oxy)benzoyl)oxy)phenyl 4-methylbenzoate n=8 (Compound (4)); 4-((4-((8-((6-methacryloyloxy)hexanoyl)oxy)octyl)oxy)benzoyl)oxy)phenyl 4-methylbenzoate n=3 (Compound (5)); 4-((4-pentylcyclohexane-1-carbonyl)oxy)phenyl 4-((6-(acryloyloxy)hexyl)oxy)benzoate (Compound (6)); 3-(3,6-difluoro-4-(4'-propyl-[1,1'-bi(cyclohexan))]-4-yl)phenoxy) propyl acrylate (Compound (7)); or a combination of any of the foregoing.

Aspect 24. The method of any one of aspects 15 to 23, wherein polymerizing the aligned combination of polymerizable mesogenic monomers comprises irradiating the applied composition with ultraviolet radiation, or heating the applied composition.

Aspect 25. A dielectric layer prepared by the method of any one of aspects 15 to 24.

Finally, it should be noted that there are alternative ways of implementing the embodiments disclosed herein. Accordingly, the present embodiments are to be considered as illustrative and not restrictive. Furthermore, the claims are not to be limited to the details given herein, and are entitled to their full scope and equivalents thereof.

What is claimed is:

1. A method of preparing a dielectric layer, comprising:
aligning a surface;
applying a composition comprising a combination of polymerizable mesogenic monomers to the aligned surface, wherein,
the combination of polymerizable mesogenic monomers comprises:
at least one polymerizable mesogenic monomer comprising two polymerizable reactive groups; and
at least one polymerizable mesogenic monomer comprising one polymerizable reactive group; and
the polymerizable mesogenic monomers have the structure of Formula (1):

$$P\text{-}(L)_w\text{-}(M^1\text{-}X)_z \qquad (1)$$

wherein
a) each —X is independently:
i) a group —R;
ii) a group represented by -(L)$_y$-R;
iii) a group represented by -(L)-R;
iv) a group represented by -(L)$_w$-Q;
v) a group represented by a moiety of Formula (2):

$$\text{-}(L)^y\text{-}M^2\text{-}(L)^w\text{-}P \qquad (2)$$

vi) a group represented by -(L)$_y$-P; or
vii) a group represented by -(L)$_w$-[(L)$_w$-P]$_y$;
b) P comprises a reactive group;
c) Q is selected from hydroxyl, amine, alkenyl, alkynyl, azido, silyl, silylhydride, oxy(tetrahydro-2H-pyran-2-yl), thiol, isocyanato, thioisocyanato, acryloxy, methacryloxy, 2-(acryloxy)ethylcarbamyl, 2-(methacryloxy)ethylcarbamyl, aziridinyl, allylcarbonate, epoxy, carboxylic acid, carboxylic ester, amide, carboxylic anhydride, and acyl halide;

d) each L is independently selected from a single bond, a polysubstituted, monosubstituted, unsubstituted or branched spacer independently comprising aryl, $(C_{1-30})$alkyl, $(C_{1-30})$alkylcarbonyloxy, $(C_{1-30})$alkylamino, $(C_{1-30})$alkoxy, $(C_{1-30})$perfluoroalkyl, $(C_{1-30})$perfluoroalkoxy, $(C_{1-30})$alkylsilyl, $(C_{1-30})$dialkylsiloxyl, $(C_{1-30})$alkylcarbonyl, $(C_{1-30})$alkoxycarbonyl, $(C_{1-30})$alkylcarbonylamino, $(C_{1-30})$alkylaminocarbonyl, $(C_{1-30})$alkylcarbonate, $(C_{1-30})$alkylaminocarbonyloxy, $(C_{1-30})$alkylaminocarbonylamino, $(C_{1-30})$alkylurea, $(C_{1-30})$alkylthiocarbonylamino, $(C_{1-30})$alkylaminocarbonylthio, $(C_{2-30})$alkene, $(C_{1-30})$thioalkyl, $(C_{1-30})$alkylsulfone, or $(C_{1-30})$alkylsulfoxide, wherein each substituent is independently chosen from $(C_{1-5})$alkyl, $(C_{1-5})$alkoxy, fluoro, chloro, bromo, cyano, $(C_{1-5})$alkanoate ester, isocyanato, thioisocyanato, and phenyl;

e) R is selected from hydrogen, $C_{1-18}$ alkyl, $C_{1-18}$ alkoxy, $C_{1-18}$ alkoxycarbonyl, $C_{3-10}$ cycloalkyl, $C_{3-10}$ cycloalkoxy, poly($C_{1-18}$ alkoxy), and a straight-chain or branched $C_{1-18}$ alkyl group that is unsubstituted or substituted with cyano, fluoro, chloro, bromo, or $C_{1-18}$ alkoxy, or poly-substituted with fluoro, chloro, or bromo; and f) each of $M^1$ and $M^2$ independently comprises a rigid straight rod-like liquid crystal group, a rigid bent rod-like liquid crystal group, or a rigid disc-like liquid crystal group;

wherein
w is an integer from 1 to 26;
y is an integer from 2 to 25; and
z is 1 or 2;
provided that when,
X is R, then w is an integer from 2 to 25, and z is 1;
X is -(L)$_y$-R, then w is 1, y is an integer from 2 to 25, and z is 1;
X is -(L)-R, then w is an integer from 3 to 26, and z is 2;
X is -(L)$_w$-Q; then if P is represented by the group Q, then w is 1, and z is 1; and if P is other than the group Q, then each w is independently an integer from 1 to 26 and z is 1;
X is a moiety of Formula (2), -(L)$_y$-M$^2$-(L)$_w$-P, then w is 1, y is an integer from 2 to 25, and z is 1;
X is -(L)$_y$-P, then w is 1, y is an integer from 2 to 25, and z is 1 and -(L)$_y$- comprises a linear sequence of at least 25 bonds between the mesogen and P; and
X is -(L)$_w$-[(L)$_w$-P]$_y$, then each w is independently an integer from 1 to 25, y is an integer from 2 to 6, and z is 1;

allowing the applied combination of polymerizable mesogenic monomers to align, wherein allowing the applied combination of polymerizable mesogenic monomers to align comprises allowing the applied combination of polymerizable mesogenic monomers to self-align; and
polymerizing the aligned combination of polymerizable mesogenic monomers to form a dielectric layer.

2. A dielectric layer comprising polymerized mesogenic monomers, wherein,
the polymerized mesogenic monomers have a dipole moment aligned perpendicular to the plane of the surface of the dielectric layer; and
the polymerized mesogenic monomers comprise the reaction product of a combination of polymerizable mesogenic monomers, wherein; the combination of polymerizable mesogenic monomers comprise:

at least one polymerizable mesogenic monomer comprising two polymerizable reactive groups; and
at least one polymerizable mesogenic monomer comprising one polymerizable reactive group; and
the polymerizable mesogenic monomers have the structure of Formula (1):

P-(L)$_w$-(M$^1$-X)$_z$        (1)

wherein,
a) each —X is independently:
i) a group —R;
ii) a group represented by -(L)$_y$-R;
iii) a group represented by -(L)-R;
iv) a group represented by -(L)$_w$-Q;
v) a group represented by a moiety of Formula (2):

-(L)$^y$-M$^2$-(L)$_w$-P        (2)

vi) a group represented by -(L)$_y$-P; or
vii) a group represented by -(L)$_w$-[(L)$_w$-P]$_y$;

b) P comprises a reactive group;

c) Q is selected from hydroxyl, amine, alkenyl, alkynyl, azido, silyl, silylhydride, oxy(tetrahydro-2H-pyran-2-yl), thiol, isocyanato, thioisocyanato, acryloxy, methacryloxy, 2-(acryloxy)ethylcarbamyl, 2-(methacryloxy)ethylcarbamyl, aziridinyl, allylcarbonate, epoxy, carboxylic acid, carboxylic ester, amide, carboxylic anhydride, and acyl halide;

d) each L is independently selected from a single bond, a polysubstituted, monosubstituted, unsubstituted or branched spacer independently comprising aryl, $(C_{1-30})$alkyl, $(C_{1-30})$alkylcarbonyloxy, $(C_{1-30})$alkylamino, $(C_{1-30})$alkoxy, $(C_{1-30})$perfluoroalkyl, $(C_{1-30})$perfluoroalkoxy, $(C_{1-30})$alkylsilyl, $(C_{1-30})$dialkylsiloxyl, $(C_{1-30})$alkylcarbonyl, $(C_{1-30})$alkoxycarbonyl, $(C_{1-30})$alkylcarbonylamino, $(C_{1-30})$alkylaminocarbonyl, $(C_{1-30})$alkylcarbonate, $(C_{1-30})$alkylaminocarbonyloxy, $(C_{1-30})$alkylaminocarbonylamino, $(C_{1-30})$alkylurea, $(C_{1-30})$alkylthiocarbonylamino, $(C_{1-30})$alkylaminocarbonylthio, $(C_{2-30})$alkene, $(C_{1-30})$thioalkyl, $(C_{1-30})$alkylsulfone, or $(C_{1-30})$alkylsulfoxide, wherein each substituent is independently chosen from $(C_{1-5})$alkyl, $(C_{1-5})$alkoxy, fluoro, chloro, bromo, cyano, $(C_{1-5})$alkanoate ester, isocyanato, thioisocyanato, and phenyl;

e) R is selected from hydrogen, $C_{1-18}$ alkyl, $C_{1-18}$ alkoxy, $C_{1-18}$ alkoxycarbonyl, $C_{3-10}$ cycloalkyl, $C_{3-10}$ cycloalkoxy, poly($C_{1-18}$ alkoxy), and a straight-chain or branched $C_{1-18}$ alkyl group that is unsubstituted or substituted with cyano, fluoro, chloro, bromo, or $C_{1-18}$ alkoxy, or poly-substituted with fluoro, chloro, or bromo; and f) each of $M^1$ and $M^2$ independently comprises a rigid straight rod-like liquid crystal group, a rigid bent rod-like liquid crystal group, or a rigid disc-like liquid crystal group;

wherein,
w is an integer from 1 to 26;
y is an integer from 2 to 25; and
z is 1 or 2;

provided that when,
X is R, then w is an integer from 2 to 25, and z is 1;
X is -(L)$_y$-R, then w is 1, y is an integer from 2 to 25, and z is 1;
X is -(L)-R, then w is an integer from 3 to 26, and z is 2;
X is -(L)$_w$-Q; then if P is represented by the group Q, then w is 1, and z is 1; and if P is other than the group Q, then each w is independently an integer from 1 to 26 and z is 1;
X is a moiety of Formula (2), -(L)$_y$-M$^2$-(L)$_w$-P, then w is 1, y is an integer from 2 to 25, and z is 1;
X is -(L)$_y$-P, then w is 1, y is an integer from 2 to 25, and z is 1 and -(L)$_y$- comprises a linear sequence of at least 25 bonds between the mesogen and P; and
X is -(L)$_w$-[(L)$_w$-P]$_y$, then each w is independently an integer from 1 to 25, y is an integer from 2 to 6, and z is 1.

3. The dielectric layer of claim 2, wherein the photo-activated group or the thermally-activated group comprises an acrylate or a methacrylate.

4. The dielectric layer of claim 2, further comprising a photoinitiator, a thermal initiator, or a combination thereof.

5. The dielectric layer of claim 2, wherein the combination of mesogenic monomers comprises a combination of photopolymerizable mesogenic monomers or a combination of thermally-activated polymerizable mesogenic monomers.

6. The dielectric layer of claim 2, wherein a molar ratio of the at least one polymerizable mesogenic monomer comprising two polymerizable reactive groups to the at least one polymerizable mesogenic monomer comprising one polymerizable reactive group is within a range from 1.5:1 to 1:1.

7. The dielectric layer of claim 2, wherein the combination of mesogenic monomers comprises 2 methyl-1,4-phenylene bis(4-(3-(acryloyloxy)propoxy)benzoate) (Compound (1)); 4-methoxyphenyl 4-((6-(acryloyloxy)hexyl)oxy)benzoate (Compound (2)); 2-methyl-1,4-phenylene bis(4-((4-(acryloyloxy)butoxy)carbonyl)oxy)benzoate) (Compound (3)); 4-((4-((8-((6-methacryloyloxy)hexanoyl)oxy)octyl)oxy)benzoyl)oxy)phenyl 4-methylbenzoate n=8 (Compound (4)); 4-((4-((8-((6-methacryloyloxy)hexanoyl)oxy)octyl)oxy)benzoyl)oxy)phenyl 4-methylbenzoate n=3 (Compound (5)); 4-((4-pentylcyclohexane-1-carbonyl)oxy) phenyl 4-((6-(acryloyloxy)hexyl)oxy)benzoate (Compound (6)); 3-(3,6-difluoro-4-(4'-propyl-[1,1'-bi(cyclohexan)]-4-yl)phenoxy)propyl acrylate (Compound (7)); or a combination of any of the foregoing.

8. The dielectric layer of claim 2, wherein the dielectric layer comprises a coating.

9. The dielectric layer of claim 2, wherein the dielectric layer comprises a film.

10. The dielectric layer of claim 2, wherein the dielectric layer exhibits piezoelectric properties.

11. The dielectric layer of claim 2, wherein the dielectric layer exhibits flexoelectric properties.

12. A dielectric device comprising the dielectric layer of claim 2.

13. The dielectric device of claim 12, wherein the dielectric device comprises a piezoelectric device, a flexoelectric device, or a combination thereof.

14. The dielectric device of claim 12, wherein,
the dielectric device comprises a substrate; and
the dielectric layer overlies the substrate.

15. The dielectric device of claim 12, wherein the dielectric device comprises:

a first electrically conductive layer underlying the dielectric layer; and
a second first electrically conductive layer overlying the dielectric layer.

16. The dielectric layer of claim 1, wherein the photo-activated group or the thermally-activated group comprises an acrylate or a methacrylate.

17. The dielectric layer of claim 2, wherein a molar ratio of the at least one polymerizable mesogenic monomer comprising two polymerizable reactive groups to the at least one polymerizable mesogenic monomer comprising one polymerizable reactive group is selected such that the polymerized mesogenic compounds on average form chains of two or three mesogenic monomers.

18. A method of preparing a dielectric layer, comprising:
aligning a surface;
applying a composition comprising a combination of polymerizable mesogenic monomers to the aligned surface, wherein,
the combination of polymerizable mesogenic monomers comprises:
at least one polymerizable mesogenic monomer comprising two polymerizable reactive groups; and
at least one polymerizable mesogenic monomer comprising one polymerizable reactive group; and
the polymerizable mesogenic monomers have the structure of Formula (1):

P-(L)$_w$-(M$^1$-X)$_z$      (1)

wherein
a) each —X is independently:
i) a group —R;
ii) a group represented by -(L)$_y$-R;
iii a group represented by -(L)-R;
iv) a group represented by -(L)$_w$-Q;
v) a group represented by a moiety of Formula (2):

-(L)$^y$-M$^2$-(L)$_w$-P      (2)

vi) a group represented by -(L)$_y$-P; or
vii) a group represented by -(L)$_w$-[(L)$_w$-P]$_y$;
b) P comprises a reactive group;
c) Q is selected from hydroxyl, amine, alkenyl, alkynyl, azido, silyl, silylhydride, oxy(tetrahydro-2H-pyran-2-yl), thiol, isocyanato, thioisocyanato, acryloxy, methacryloxy, 2-(acryloxy)ethylcarbamyl, 2-(methacryloxy)ethylcarbamyl, aziridinyl, allylcarbonate, epoxy, carboxylic acid, carboxylic ester, amide, carboxylic anhydride, and acyl halide;
d) each L is independently selected from a single bond, a polysubstituted, monosubstituted, unsubstituted or branched spacer independently comprising aryl, (C$_{1-30}$)alkyl, (C$_{1-30}$)alkylcarbonyloxy, (C$_{1-30}$)alkylamino, (C$_{1-30}$)alkoxy, (C$_{1-30}$)perfluoroalkyl, (C$_{1-30}$) perfluoroalkoxy, (C$_{1-30}$)alkylsilyl, (C$_{1-30}$)dialkylsiloxyl, (C$_{1-30}$)alkylcarbonyl, (C$_{1-30}$)alkoxycarbonyl, (C$_{1-30}$)alkylcarbonylamino, (C$_{1-30}$)alkylaminocarbonyl, (C$_{1-30}$)alkylcarbonate, (C$_{1-30}$)alkylaminocarbonyloxy, (C$_{1-30}$)alkylaminocarbonylamino, (C$_{1-30}$) alkylurea, (C$_{1-30}$)alkylthiocarbonylamino, (C$_{1-30}$) alkylaminocarbonylthio, (C$_{2-30}$)alkene, (C$_{1-30}$) thioalkyl, (C$_{1-30}$)alkylsulfone, or (C$_{1-30}$) alkylsulfoxide, wherein each substituent is independently chosen from (C$_{1-5}$)alkyl, (C$_{1-5}$) alkoxy, fluoro, chloro, bromo, cyano, (C$_{1-5}$)alkanoate ester, isocyanato, thioisocyanato, and phenyl;

e) R is selected from hydrogen, $C_{1-18}$ alkyl, $C_{1-18}$ alkoxy, $C_{1-18}$ alkoxycarbonyl, $C_{3-10}$ cycloalkyl, $C_{3-10}$ cycloalkoxy, poly($C_1$-18 alkoxy), and a straight-chain or branched $C_{1-18}$ alkyl group that is unsubstituted or substituted with cyano, fluoro, chloro, bromo, or $C_{1-18}$ alkoxy, or poly-substituted with fluoro, chloro, or bromo; and f) each of $M^1$ and $M^2$ independently comprises a rigid straight rod-like liquid crystal group, a rigid bent rod-like liquid crystal group, or a rigid disc-like liquid crystal group;

wherein,
w is an integer from 1 to 26;
y is an integer from 2 to 25; and
z is 1 or 2;

provided that when,
X is R, then w is an integer from 2 to 25, and z is 1;
X is -(L)$_y$-R, then w is 1, y is an integer from 2 to 25, and z is 1;
X is -(L)-R, then w is an integer from 3 to 26, and z is 2;
X is -(L)$_w$-Q; then if P is represented by the group Q, then w is 1, and z is 1; and if P is other than the group Q, then each w is independently an integer from 1 to 26 and z is 1;
X is a moiety of Formula (2), -(L)$_y$-M$^2$-(L)$_w$-P, then w is 1, y is an integer from 2 to 25, and z is 1;
X is -(L)$_y$-P, then w is 1, y is an integer from 2 to 25, and z is 1 and -(L)$_y$- comprises a linear sequence of at least 25 bonds between the mesogen and P; and
X is -(L)$_w$-[(L)$_w$-P]$_y$, then each w is independently an integer from 1 to 25, y is an integer from 2 to 6, and z is 1;

allowing the applied combination of polymerizable mesogenic monomers to align; and
polymerizing the aligned combination of polymerizable mesogenic monomers to form a dielectric layer, wherein the polymerized mesogenic monomers have a long axis aligned parallel to the plane of the surface of the dielectric layer.

19. The method of claim 18, wherein aligning comprises rubbing the surface.

20. The method of claim 18, wherein a molar ratio of the at least one polymerizable mesogenic monomer comprising two polymerizable reactive groups to the at least one polymerizable mesogenic monomer comprising one polymerizable reactive group is selected such that the polymerized mesogenic compounds on average form chains of two or three mesogenic monomers.

21. A method of preparing a dielectric layer, comprising:
aligning a surface;
applying a composition comprising a combination of polymerizable mesogenic monomers to the aligned surface, wherein,
the combination of polymerizable mesogenic monomers comprises:
at least one polymerizable mesogenic monomer comprising two polymerizable reactive groups; and
at least one polymerizable mesogenic monomer comprising one polymerizable reactive group; and
the polymerizable mesogenic monomers have the structure of Formula (1):

$$P\text{-}(L)_w\text{-}(M^1\text{-}X)_z \qquad (1)$$

wherein
a) each —X is independently:
i) a group —R;
ii) a group represented by -(L)$_y$-R;
iii) a group represented by -(L)-R;
iv) a group represented by -(L)$_w$-Q;
v) a group represented by a moiety of Formula (2):

$$\text{-}(L)^y\text{-}M^2\text{-}(L)_w\text{-}P \qquad (2)$$

vi) a group represented by -(L)$_y$-P; or
vii) a group represented by -(L)$_w$-[(L)$_w$-P]$_y$;
b) P comprises a reactive group;
c) Q is selected from hydroxyl, amine, alkenyl, alkynyl, azido, silyl, silylhydride, oxy(tetrahydro-2H-pyran-2-yl), thiol, isocyanato, thioisocyanato, acryloxy, methacryloxy, 2-(acryloxy)ethylcarbamyl, 2-(methacryloxy)ethylcarbamyl, aziridinyl, allylcarbonate, epoxy, carboxylic acid, carboxylic ester, amide, carboxylic anhydride, and acyl halide;
d) each L is independently selected from a single bond, a polysubstituted, monosubstituted, unsubstituted or branched spacer independently comprising aryl, ($C_{1-30}$)alkyl, ($C_{1-30}$)alkylcarbonyloxy, ($C_{1-30}$)alkylamino, ($C_{1-30}$)alkoxy, ($C_{1-30}$)perfluoroalkyl, ($C_{1-30}$) perfluoroalkoxy, ($C_{1-30}$)alkylsilyl, ($C_{1-30}$)dialkylsiloxyl, ($C_{1-30}$)alkylcarbonyl, ($C_{1-30}$)alkoxycarbonyl, ($C_{1-30}$)alkylcarbonylamino, ($C_{1-30}$)alkylaminocarbonyl, ($C_{1-30}$)alkylcarbonate, ($C_{1-30}$)alkylaminocarbonyloxy, ($C_{1-30}$)alkylaminocarbonylamino, ($C_{1-30}$) alkylurea, ($C_{1-30}$)alkylthiocarbonylamino, ($C_{1-30}$) alkylaminocarbonylthio, ($C_{2-30}$)alkene, ($C_{1-30}$) thioalkyl, ($C_{1-30}$)alkylsulfone, or ($C_{1-30}$) alkylsulfoxide, wherein each substituent is independently chosen from ($C_{1-5}$)alkyl, ($C_{1-5}$) alkoxy, fluoro, chloro, bromo, cyano, ($C_{1-5}$)alkanoate ester, isocyanato, thioisocyanato, and phenyl;
e) R is selected from hydrogen, $C_{1-18}$ alkyl, $C_{1-18}$ alkoxy, $C_{1-18}$ alkoxycarbonyl, $C_{3-10}$ cycloalkyl, $C_{3-10}$ cycloalkoxy, poly($C_{1-18}$ alkoxy), and a straight-chain or branched $C_{1-18}$ alkyl group that is unsubstituted or substituted with cyano, fluoro, chloro, bromo, or $C_{1-18}$ alkoxy, or poly-substituted with fluoro, chloro, or bromo; and
f) each of $M^1$ and $M^2$ independently comprises a rigid straight rod-like liquid crystal group, a rigid bent rod-like liquid crystal group, or a rigid disc-like liquid crystal group;

wherein,
w is an integer from 1 to 26;
y is an integer from 2 to 25; and
z is 1 or 2;

provided that when,
X is R, then w is an integer from 2 to 25, and z is 1;
X is -(L)$_y$-R, then w is 1, y is an integer from 2 to 25, and z is 1;
X is -(L)-R, then w is an integer from 3 to 26, and z is 2;
X is -(L)$_w$-Q; then if P is represented by the group Q, then w is 1, and z is 1; and if P is other than the group Q, then each w is independently an integer from 1 to 26 and z is 1;
X is a moiety of Formula (2), -(L)$_y$-M$^2$-(L)$_w$-P, then w is 1, y is an integer from 2 to 25, and z is 1;
X is -(L)$_y$-P, then w is 1, y is an integer from 2 to 25, and z is 1 and -(L)$_y$- comprises a linear sequence of at least 25 bonds between the mesogen and P; and X is $-(L)_w-[(L)_y-P]_y$, then each w is independently an integer from 1 to 25, y is an integer from 2 to 6, and z is 1;

allowing the applied combination of polymerizable mesogenic monomers to align; and polymerizing the aligned combination of polymerizable mesogenic monomers to form a dielectric layer, wherein the polymerized mesogenic monomers have a dipole moment aligned perpendicular to the plane of the surface of the dielectric layer.

22. A dielectric device comprising the dielectric layer of claim 16.

* * * * *